(12) United States Patent
Ishida et al.

(10) Patent No.: US 6,365,438 B1
(45) Date of Patent: Apr. 2, 2002

(54) PROCESS FOR MANUFACTURING SEMICONDUCTOR PACKAGE AND CIRCUIT BOARD ASSEMBLY

(75) Inventors: Yoshihiro Ishida; Kiyoshi Shimizu; Tetsuo Sato; Shinichi Nishikata, all of Tanashi; Shuichi Ishiwata, Tokorozawa; Atsushi Omura, Tokorozawa; Tsutomu Ohara, Tokorozawa, all of (JP)

(73) Assignee: Citizen Watch Co., Ltd., Tokyo (JP)

( * ) Notice: Subject to any disclaimer, the term of this patent is extended or adjusted under 35 U.S.C. 154(b) by 0 days.

(21) Appl. No.: 09/194,735

(22) PCT Filed: Apr. 24, 1998

(86) PCT No.: PCT/JP98/01905

§ 371 Date: Dec. 2, 1998

§ 102(e) Date: Dec. 2, 1998

(87) PCT Pub. No.: WO98/52220

PCT Pub. Date: Nov. 19, 1998

(30) Foreign Application Priority Data

| May 9, 1997 | (JP) | 9-119220 |
| Jun. 16, 1997 | (JP) | 9-158688 |
| Jun. 16, 1997 | (JP) | 9-158689 |
| Sep. 22, 1997 | (JP) | 9-256503 |
| Oct. 28, 1997 | (JP) | 9-259317 |

(51) Int. Cl.$^7$ .............................................. H01L 21/44
(52) U.S. Cl. ........................ 438/118; 438/113; 438/464
(58) Field of Search ................................. 438/127, 464, 438/128, 129, 460, 130, 118, 976, 119, 120, 121, 928, 113, 106, 107, 112, 114; 257/668, 669, 670

(56) References Cited

U.S. PATENT DOCUMENTS

| 4,812,949 A | * | 3/1989 | Fontan et al. ............... 361/386 |
| 5,019,944 A | * | 5/1991 | Ishii et al. .................. 361/400 |
| 5,389,182 A | * | 2/1995 | Mignardi .................... 156/344 |
| 5,668,404 A | * | 9/1997 | Abe et al. ................... 257/668 |
| 5,672,548 A | * | 9/1997 | Culnane et al. ............. 437/209 |
| 5,766,982 A | * | 6/1998 | Takahashi et al. .......... 438/127 |
| 5,785,799 A | * | 7/1998 | Culnane et al. ............. 156/379 |
| 5,793,099 A | * | 8/1998 | Murakami et al. .......... 257/666 |
| 5,834,790 A | * | 11/1998 | Suzuki ........................ 257/10 |
| 5,872,051 A | * | 2/1999 | Fallon et al. ............... 438/616 |
| 5,960,260 A | * | 9/1999 | Umehara et al. ........... 438/118 |
| 5,970,320 A | * | 10/1999 | Yamasaki et al. ........... 438/123 |
| 5,981,315 A | * | 11/1999 | Murakami et al. .......... 438/127 |
| 6,197,616 B1 | * | 3/2001 | Hyoudo et al. ............. 438/113 |

FOREIGN PATENT DOCUMENTS

| JP | 8-64718 | 3/1996 |
| JP | 8-153819 | 6/1998 |

\* cited by examiner

Primary Examiner—Charles Bowers
Assistant Examiner—Laura Schillinger
(74) Attorney, Agent, or Firm—Kanesaka & Takeuchi

(57) ABSTRACT

Semiconductor packages which are prepared by forming circuit substrates, mounting IC chips on the circuit substrates, encapsulating the IC chips on the circuit substrates with resin, and forming electrodes, are attached to a standard member. After this attaching step, the semiconductor packages are subjected to a cutting step where the semiconductor packages are diced into a plurality of circuit substrates.

46 Claims, 18 Drawing Sheets

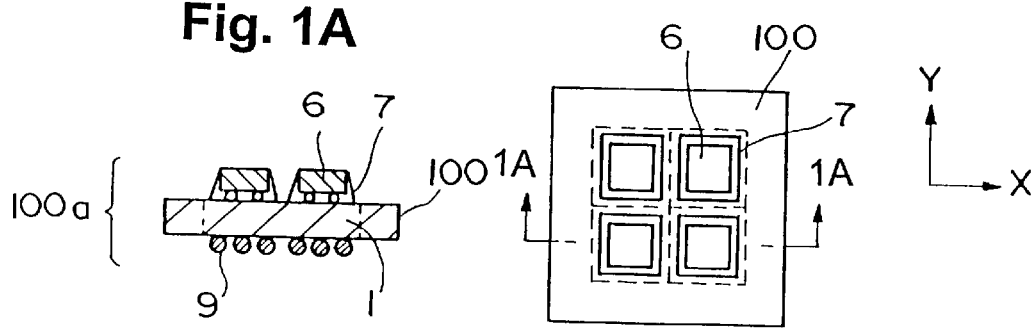
Fig. 1A / Fig. 1A'
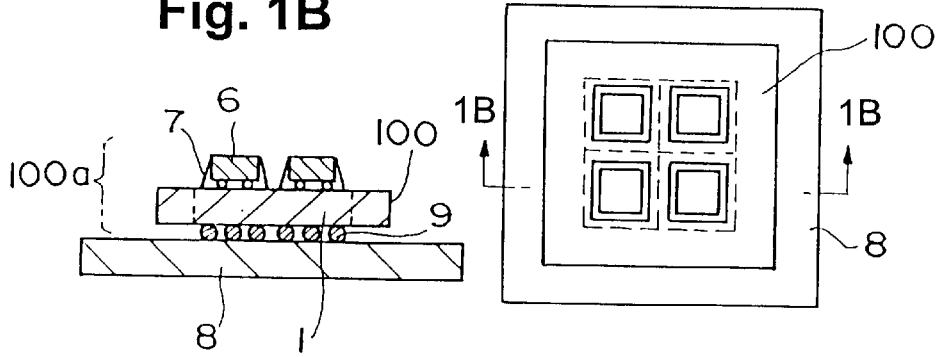
Fig. 1B / Fig. 1B'
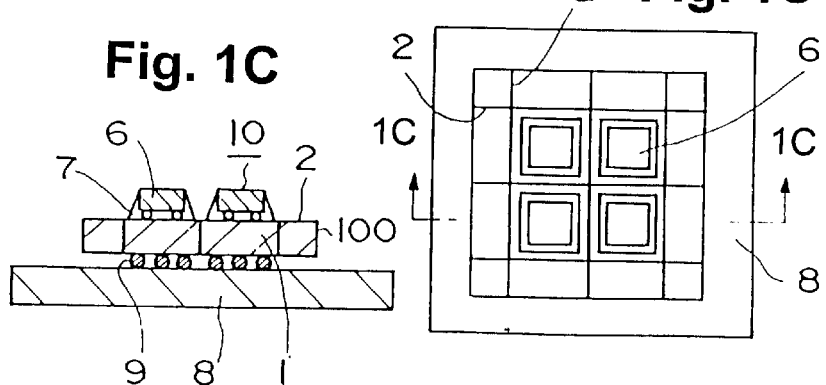
Fig. 1C / Fig. 1C'
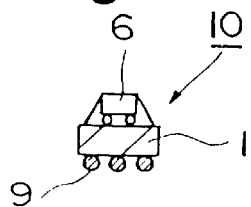 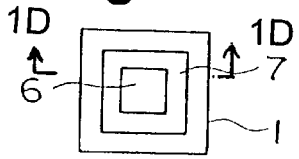
Fig. 1D / Fig. 1D'

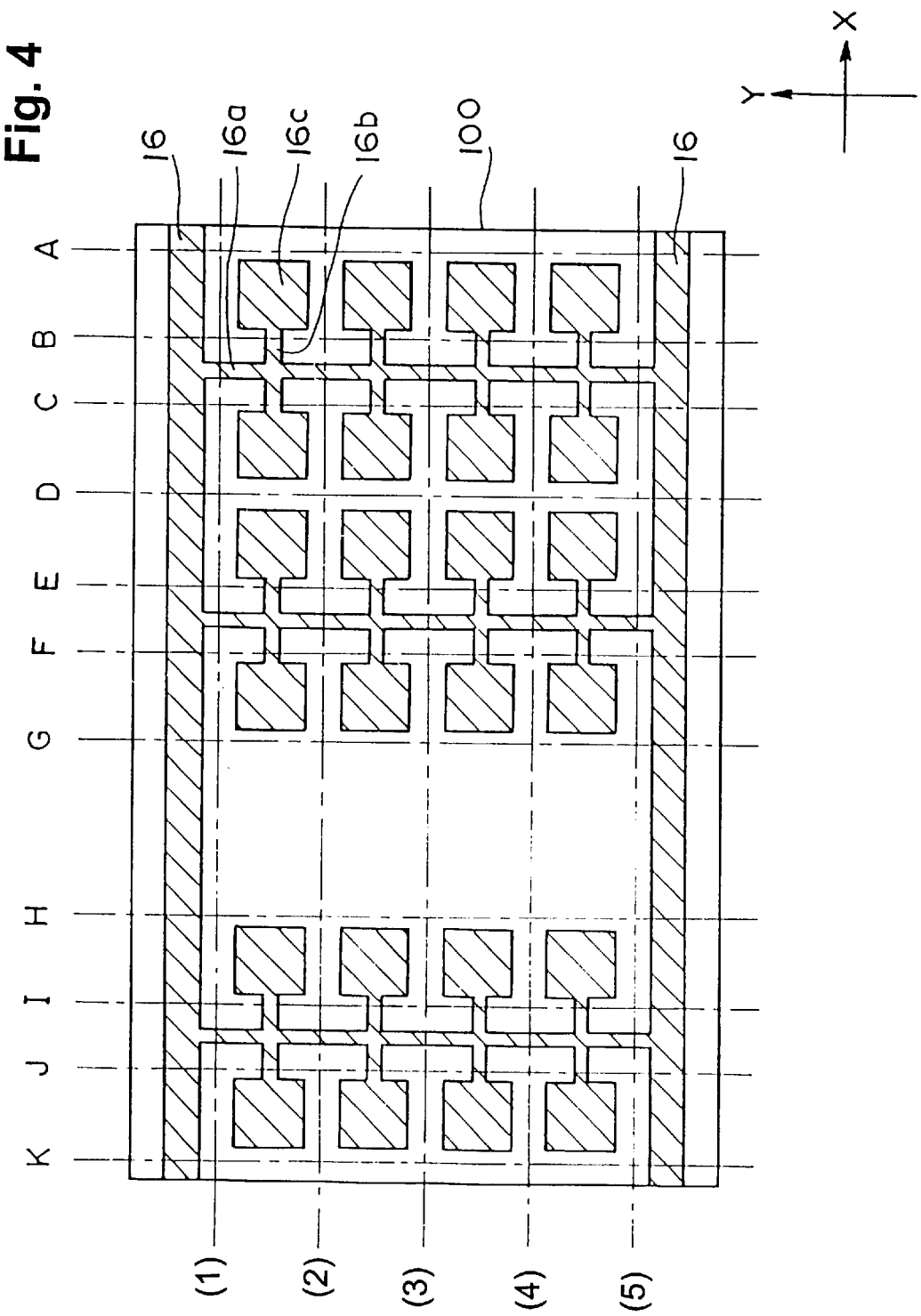

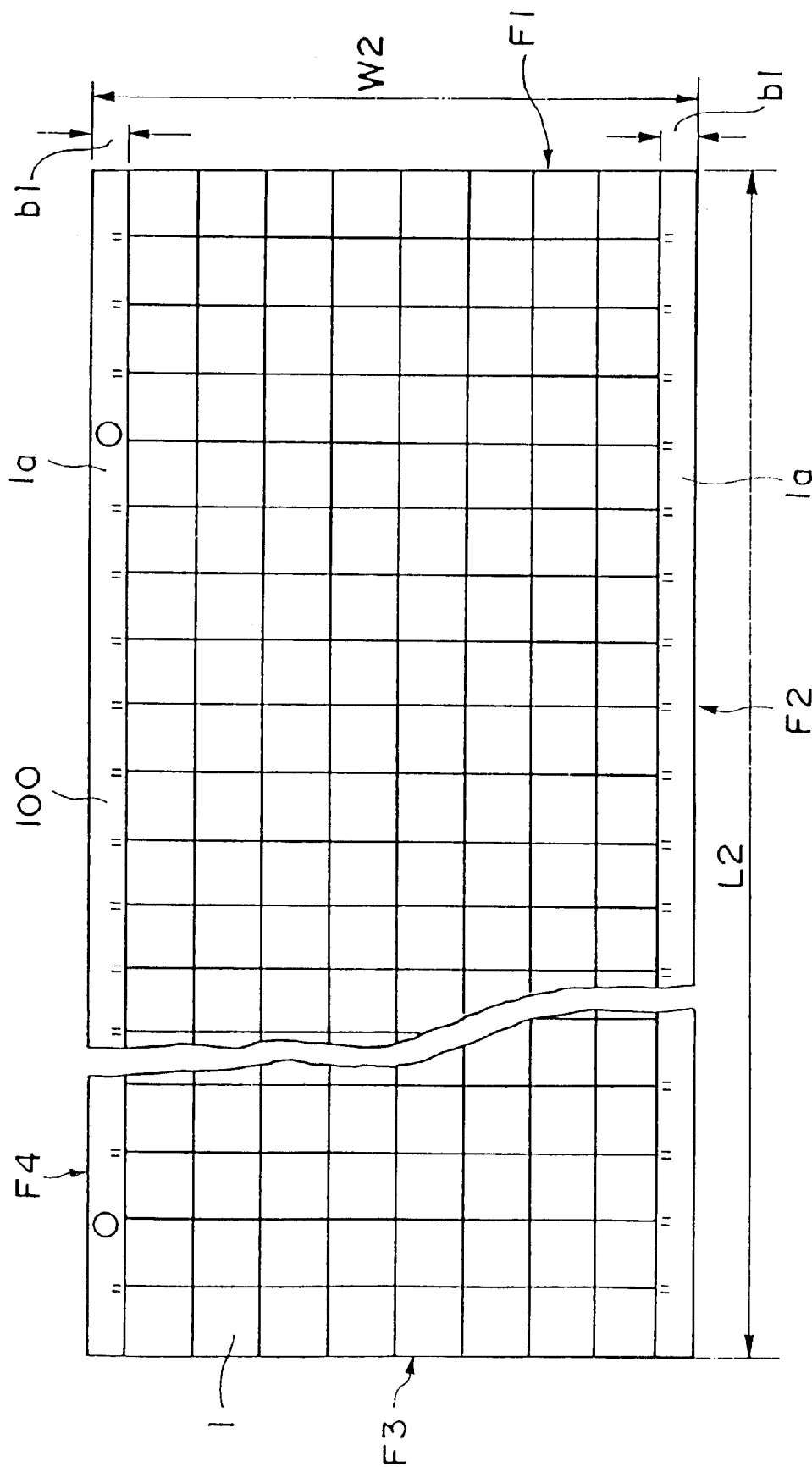

Fig. 23A
Prior Art
Fig. 23A'
Prior Art
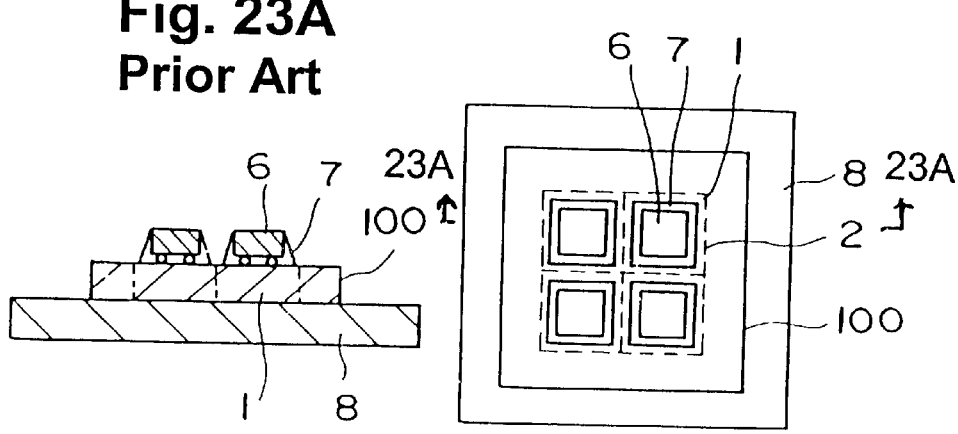
Fig. 23B
Prior Art
Fig. 23B'
Prior Art
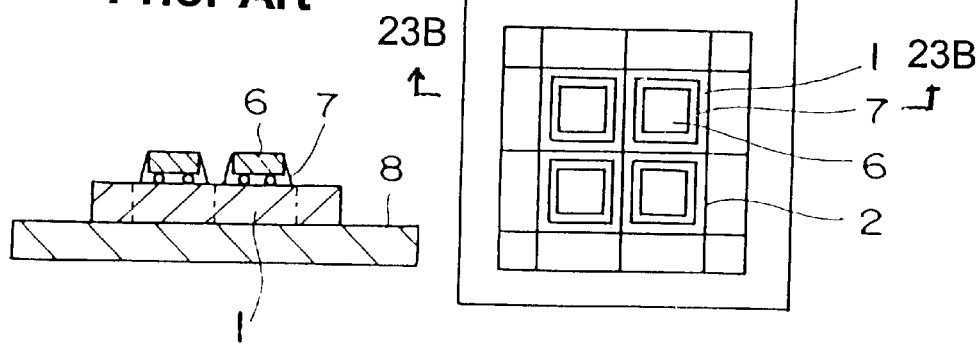
Fig. 23C
Prior Art
Fig. 23C'
Prior Art
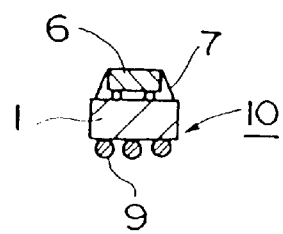
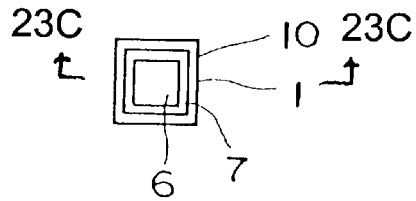

PROCESS FOR MANUFACTURING SEMICONDUCTOR PACKAGE AND CIRCUIT BOARD ASSEMBLY

TECHNICAL FIELD

The present invention relates to a manufacturing process for a small-sized and thin type semiconductor package. More particularly, to a manufacturing process for a semiconductor package by which an circuit substrate will not be wasted and which allows a plurality of packages to be taken from the substrate thereby having the highly productivity and to an circuit substrate aggregation or assembly used for manufacturing such packages.

BACKGROUND TECHNOLOGY

As a semiconductor package becomes smaller and more integrated, the flip-chip bonding method has been developed wherein a bare chip is directly mounted on a substrate with its face directed downward. More recently, a variety of portable tools such as a VTR having a camera integrated thereinto and a personal handy telephone is appearing into the market one after another and such a portable tool has a package as small as a bare chip integrated therein, namely a chip size/scale package (CSP). Because of such a situation, CSP's are strongly needed in the market, thereby the development of CSP's recently is under accelerating.

In manufacturing circuit board aggregation or assembly 100 at a manufacturer's site, a roll of 1 m wide glass filler sheet having a resin impregnated thereinto is cut in accordance with a standard size of 1 m×1 m or 1 m×1.2 m. Then, a copper film is laminated onto the both sides of the standardized sheet, which will be pressed into an original substrate. The original substrate is further cut into substrate materials with a convenient and readily usable size.

In FIG. 20, a plan view of substrate material 110 is shown. This substrate material is obtained by cutting an original sheet with a standard size into nine pieces. Substrate material 110 measures 330 mm wide (W) and 330 mm long (L). For example, ten (10) strips of circuit board aggregation 100 will be obtained by cutting this substrate material 110. Each circuit substrate aggregation is, for example, 56 mm wide (W1) and 115 mm long (L1). Each circuit substrate aggregation 100 is, as illustrated in FIG. 20, arranged as two vertical rows X and five horizontal columns.

In FIG. 21, an example of circuit substrate aggregation 100 is shown. The circuit substrate aggregation has a blank area (margins) for manufacturing packages along the perimeter. In particular, the substrate has a b1 wide (for example 5 mm) manufacturing blank area along the vertical perimeter and b2 wide (for example 7 mm) manufacturing blank area along the horizontal perimeter.

In the area surrounded by the manufacturing blank area of the circuit substrate aggregation 100, cut lines 2 are formed in the X and Y directions which are perpendicular to each other so as to form a plurality of individual circuit substrate 1 to be obtained by cutting it. From circuit substrate aggregation 100 as shown in FIG. 21, fifty-five (=5×11) circuit substrates having the size of 9 mm×9 mm can be obtained.

A conventional manufacturing process for CSP type semiconductor packages will now be briefly explained by referring to FIGS. 22A to 23C'. In FIGS. 22A–22C and FIGS. 23A–23C, respectively, top plan views are shown in the right side of the figures while cross-sectional views obtained by cutting the top plan views along the cutting lines are shown in the left side. In the example of FIGS. 22A to 23C', four circuit substrates are illustrated to be taken.

A conventional process for manufacturing semiconductor packages includes the steps for forming a circuit substrate (FIG. 22A'), mounting IC chips onto the substrate (FIG. 22B'), encapsulating the mounted chips with resin (FIG. 22C'), attaching standard member on the encapsulated (sealing) chips (FIG. 23A'), dicing the chips (FIG. 23B') and forming electrodes on the chips (FIG. 23C').

In manufacturing semiconductor packages, through-holes (not shown) are formed on the circuit substrate aggregation 100, both surfaces of which are copper laminated in the step of forming the circuit substrate.

Then, on the both surfaces of this circuit substrate aggregation 100, copper-plated layers are formed by means of electroless copper plating and electro copper plating. Further, the copper-plated layers are laminated with etching resist, which will be sequentially exposed to light and developed to form pattern masks. Thereafter, the copper-plated layers are subjected to pattern etching via the pattern masks by using etching solution. Through this pattern etching process, several sets of IC connecting electrodes (bonding pattern) 3 for a plurality of chips are formed on the upper surface of circuit substrate aggregation 100 and external connection electrodes 4, which are pad electrodes arranged in a matrix, are formed on the bottom side, respectively.

Next, a solder resist processing follows, thereby forming a resist film on the bottom side of circuit substrate aggregation 100. This resist film has openings where external connection electrodes 4, which are the solderable region, are exposed. By forming this resist film in this way, the bottom surface of integrated surface 100 will be planarized. Thus, the circuit substrate aggregation is completed wherein a number of same-shaped platable regions are arranged on the bottom surface in a matrix manner (FIGS. 22A and 22A').

In the next step of mounting the IC chips on the substrate, solder bumps 5 are formed on the pad electrode of the IC wafer (not shown). The process for forming solder bumps 5 includes the stud bump method, ball bump method and plated bump method. The plated bump method among these is suitable for miniaturizing the IC chips because it allows the bumps to be formed in a narrow space between the pad electrodes.

Then, the IC wafer on which the solder bumps are formed is cut into chips of a predetermined size while being attached on a adhesive tape, to thereby form the IC chips 6. In this cutting process, the full-cut scheme is employed in cutting the wafer in the X and Y directions with an apparatus such as a dicing saw. After the wafer is cut, IC chips 6 on the adhesive tape are separated into a plurality of individual units.

Next, flux (not shown) is applied onto a predetermined location of either the solder bumps of the divided IC chips or IC connecting electrodes 3 formed on the upper surface of circuit substrate aggregation 100. When this is completed, IC chips 6 are mounted on the main surface of circuit board aggregation 100 in such a manner that one chip is mounted on a single circuit substrate. The surface of IC chip 6 on which solder bumps 5 are formed is opposed against the upper side of the circuit substrate aggregation and solder bumps 5 are positioned on IC connecting electrodes 3. Then, IC connecting electrodes 3 are electrically connected to IC chips 6 by means of a solder reflow processing. As described above, IC chips 6 (flip-chips) are mounted onto circuit board aggregation 100 (FIGS. 22B and 22B').

In the next encapsulation step, a plurality of IC chips 6 is integrally encapsulated using a thermosetting resin 7 by performing a side-potting across the adjacent IC chips 6. In such a manner, the same IC chips 6 are secured on each circuit substrate 1 of the circuit substrate aggregation 100 with the face down direction as shown in FIGS. 22C and 22C'.

In the next step of attaching a standard member, the planar bottom surface of the circuit substrate aggregation on which the IC chips are mounted is attached to standard member 8 by using a adhesive or a PSA (pressure-sensitive adhesive) tape. The adhesion between circuit substrate aggregation 100 and standard member 8 is secured because both of the attached surfaces are planar (FIGS. 23A and 23A').

In the next dicing step, as shown in FIGS. 23B and 24B', circuit substrate aggregation 100 is cut with a cutting device such as a dicing saw along the cut lines formed on the circuit substrate aggregation in the X and Y directions and the cut circuit substrate 1 is separated into individual circuit substrates 1 Here a dicing machine DFD-640 (product name) equipped with a dicing blade NBC-ZB1090S3 (product name) both manufactured by Disco Corporation is used in this cutting process.

After the dicing step, circuit substrates 1 are detached from standard member 8 by dissolving the adhesive and the like with a solution.

In the next step of forming the electrodes, solder balls are attached to external connection electrodes 4 formed on the bottom surface of the individual circuit substrate. Then, the solder balls are subjected to a reflow process and ball electrodes are formed.

In the above described steps, the formation of individual flip-chip BGA's (ball grid arrays) 200 is completed.

However, the above described process for manufacturing the semiconductor packages suffers from the following problems. In the conventional method, the solder ball electrodes are individually formed on a single circuit substrate already diced from the integrated semiconductor substrates. Thus, in a small package CSP, the distance between the perimeter of the circuit substrate and the center of the solder ball electrode positioned most adjacent to the perimeter tends to be small, so that it will be difficult to maintain the blank area reserved to secure an apparatus for attaching the solder balls in the step of forming the solder balls. Further, since the solder balls are attached to each of the single circuit substrates, the productivity of this method is low, so that the manufacturing cost increases.

Also, the conventional circuit board aggregation have further problems. As small portable devices are required to be miniaturized, the packages have been strongly requested to be miniaturized and made thinner as well as to lower the manufacturing cost of the packages as much as possible. Since blank areas are reserved for manufacturing purposes, the number of the circuit substrates to be taken therefrom tends to be small. For example, when the blank area b2 along the horizontally oriented F1 is 7 mm wide, the total width of the two blank areas for manufacturing purposes along the both sides will be 14 mm, which is equal to more than one row of circuit substrate 1 which is 9 mm×9 mm. If all the blank areas are eliminated from circuit substrate aggregation 100 as shown in FIG. 21, as many as sixty circuit substrates, each having an area of 9 mm×9 mm, can be taken from the substrate. In reality, however, only 55 circuit substrates 1 may be taken because there exist blank areas. Therefore, about 9% of the circuit substrate will be wasted.

Accordingly, it would be appreciated from the above context that an object of the present invention is to provide a circuit board aggregation or assembly, the productivity of which is high and thus which may be preferably used to manufacture semiconductor substrates at a low cost.

DISCLOSURE OF THE INVENTION

The process for manufacturing a semiconductor package with mounted IC chips of the present invention comprises, a circuit board fabricating step for forming a plurality of bonding patterns for mounting IC chips on a main surface of a circuit board aggregation or assembly which can be divided into a plurality of circuit boards, and forming a plurality of electrode patterns for external connection on the back of this circuit board aggregation, an IC chip mounting step for mounting IC chips on each circuit board of the main surface of the circuit board aggregation and electrically connecting the bonding patterns and IC chips, a sealing step for sealing the IC chips with a sealing resin, an electrode forming step for providing projections on the electrode patterns for external connection, an attaching step for causing the package aggregation unit fabricated by the circuit board fabricating step, IC chip mounting step, sealing step, and electrode forming step to be affixed to a standard member, and a cutting step which comprises cutting the attached package aggregation unit into each circuit board, thereby obtaining a plurality of semiconductor packages each including one circuit board.

In the present invention, since the cutting step follows the electrode forming step, electrodes having the projections can be formed on all circuit boards of the circuit board aggregation at the same time. This ensures the high productivity and the reduction of the production costs.

In addition, since the electrodes having the projections are simultaneously formed on each circuit board of the circuit board aggregation, the margin for the fabrication of the circuit board aggregation can be used as the margin for a solder ball on anchoring a jig in the electrodes having projection forming step.

Accordingly, a reliable, highly productive, and inexpensive process for manufacturing the semiconductor packages which is suitable for mounting on small portable equipment can be provided by the present invention.

In the process for manufacturing the semiconductor packages of the present invention, a spacer can be provided on the area from which the circuit board packages are separated such as a margin for fabrication. If the area to be separated is secured to the standard member through this spacer, pieces in the separation area can be prevented from jumping up and down in the dicing machine during the cutting operation. As a result, damage of the dicing blades and IC chips can be prevented.

Moreover, the circuit board aggregation of the present invention is provided with the margins for fabrication only along the peripheries of two opposing sides out of four sides of the quadrilateral surrounding the circuit board aggregation. This enables a greater number of circuit boards to be made from the circuit boards aggregation.

Accordingly, a circuit board aggregation which is suitable for the manufacture of the semiconductor packages inexpensively and with high productivity can be provided by the present invention.

Moreover, the manufacturing process can be automated and productivity of the circuit board aggregation can be further improved by providing the substrate with a width (W) equivalent to a common length (A) which satisfies the following conditions. Specifically, a length MI obtained by dividing the original length (L) of one side of a specified size substrate by K1 (M1=L/K1) and a length M2 obtained by dividing the original length (L) by K2 (M2=L/K2) are respectively a product of the common length (A) multiplied by an integer. This substantially reduces the production costs for the circuit board aggregation of the present invention, which results in a decrease in manufacturing costs of the semiconductor packages.

BRIEF DESCRIPTION OF THE DRAWINGS

FIGS. 1A–1D' relate to a first embodiment of the invention and show step diagrams to be referred to in describing a process for manufacturing semiconductor packages wherein FIGS. 1A and 1A' show diagrams to be referred to in describing the step of forming the electrodes, FIGS. 1B and 1B' show diagrams to be referred to in describing the step of affixation, FIGS. 1C and 1C' show diagrams 5 to be referred to in describing the step of dicing and FIGS. 1D and 1D' show a completed semiconductor package. In the figures, FIGS. 1A', 1B', 1C', 1D' are plan views shown on the right side while FIGS. 1A, 1B, 1C, 1D are cross sectional views cut along the respective cutting lines shown on the left side.

FIGS. 2A and 2B relate to the first embodiment of the invention and show diagrams which will be referred to in describing the step of planarization wherein FIG. 2A shows a cross sectional view used to describe the first exemplary step and FIG. 2B shows a cross sectional view used to describe the second exemplary step.

FIGS. 3A and 3B relate to the first embodiment of the invention and show diagrams which will be referred to in describing the step of forming planar surfaces wherein FIG. 2A shows a cross sectional view to be referred to in describing the third exemplary step and FIG. 3B shows a cross sectional view to be referred to in describing the fifth exemplary step.

FIG. 4 relates to the first embodiment of the invention and shows a plan view of the circuit substrate aggregation which will be referred to in describing the step of dicing.

FIGS. 6A and 6B relate to the second embodiment of the invention wherein FIG. 6A shows a back surface view of a circuit substrate aggregation on which spacers are formed in accordance with the second exemplary step and FIG. 6B shows a cross sectional view cut along line 6B—6B of FIG. 6A.

FIGS. 7A and 7B relate to the second embodiment of the invention wherein FIG. 7A shows a back surface view of a circuit substrate aggregation on which spacers are formed in accordance with the third exemplary step and FIG. 7B shows the cross sectional view cut along line 7B—7B of FIG. 7A.

FIGS. 8A–8B' relate to a third embodiment of the invention wherein FIGS. 8A, 8A' show diagrams to be referred to in describing the step of affixation and FIGS. 8B, 8B' show diagrams to be referred to in describing the step of dicing. In the figures, FIGS. 8A' and 8B' are plan views shown on the right side while FIGS. 8A and 8B are cross sectional views cut along the respective cutting lines of the plan views and shown on the left side.

FIGS. 9A and 9B relate to the third embodiment of the invention and will be referred to in describing the planarization step wherein FIG. 9A shows a cross sectional view to be referred to in describing the first exemplary step and FIG. 9B shows a cross sectional view to be referred to in describing the second exemplary step.

FIGS. 10A and 10B relate to the third embodiment of the invention and will be referred to in describing the planarization step wherein FIG. 10A shows a cross sectional view to be referred to in describing the third exemplary step and FIG. 10B shows a cross sectional view to be referred to in describing the fourth exemplary step.

FIGS. 12A–12D relate to a fourth embodiment of the invention wherein FIG. 12A shows a diagram to be referred to in describing the step of forming electrodes, FIG. 12B shows a diagram to be referred to in describing the first exemplary step of forming spacers, FIG. 12C shows a diagram to be referred to in describing the step of affixation and FIG. 12D shows a diagram to be referred to in describing the step of dicing.

FIGS. 14A and 14B relate to the fourth embodiment of the invention wherein FIG. 14A shows a cross sectional view of an integrated package body on which spacers are formed in accordance with the second exemplary step and FIG. 14B shows a cross sectional view of an integrated package body on which spacers are formed in accordance with the third exemplary step.

FIG. 15A and FIG. 15B relate to a fifth embodiment of the invention wherein FIG. 15A shows a diagram to be referred to in describing the step of affixation and FIG. 15B shows a diagram to be referred to in describing the step of dicing.

FIGS. 16A and 16B relate to a sixth embodiment of the invention wherein FIG. 16A shows a diagram to be referred to in describing the step of affixation and FIG. 16B shows a diagram to be referred to in describing the step of dicing.

FIG. 17 relates to a seventh embodiment of the invention and shows a plan view of the circuit substrate aggregation.

FIGS. 18A–18C' relate to an eighth embodiment of the invention and will be referred to in describing a process for manufacturing semiconductor packages wherein FIGS. 18A, 18A' show diagrams to be referred to in describing the step of forming circuit substrates, FIGS. 18B, 18B' show diagrams to be referred to in describing the step of mounting IC's and FIGS. 18C, 18C' show diagrams to be referred to in describing the step of resin encapsulation. In the drawings, FIGS. 18A', 18B', 18C' are plan views shown on the right side while FIGS. 18A, 18B, 18C are cross sectional views cut along the respective cutting lines and shown on the left side. In FIGS. 18B and 18C, IC connecting electrodes 3 and externally connecting electrodes 4 are not shown.

FIGS. 19A–19D' are step diagrams following FIGS. 18C and 18C' wherein FIGS. 19A, 19A' show diagrams to be referred to in describing the step of forming electrodes, FIGS. 19B, 19B' show diagrams to be referred to in describing the step of affixation, FIGS. 19C, 19C' show diagrams to be referred to in describing the step of forming spacers and FIGS. 19D, 19D' show diagrams to be referred to in describing the step of dicing. In the drawings, FIGS. 19A', 19B', 19C', 19D' are plan views shown on the right side while FIGS. 19A, 19B, 19C, 19D are cross sectional views cut along the respective cutting lines of the plan views and shown on the left side. In FIGS. 19A to 19D', IC connecting electrodes 3 and externally connecting electrodes 4 are not shown.

FIGS. 22A to 22C' show step diagrams to be referred to in describing a conventional process for manufacturing semiconductor packages wherein FIGS. 22A, 33A' show diagrams to be referred to in describing the step of forming circuit substrates, FIGS. 22B, 22B' show diagrams to be referred to in describing the step of mounting IC's and FIGS. 22C, 22C' show diagrams to be referred to in describing the step of resin encapsulation. In the drawings, FIGS. 22A', 22B', 22C' are plan views shown on the right side while FIGS. 22A, 22B, 22C are cross sectional views cut along the respective cutting lines of the plan views and shown on the left side. In FIGS. 22B' and 22C', IC connecting electrodes 3 and externally connecting electrodes 4 are not shown.

FIGS. 23A–23C' are step diagrams following FIGS. 22C, 22C' wherein FIGS. 23A, 23A' show diagrams to be referred to in describing the step of forming electrodes, FIGS. 23B, 23B' show diagrams to be referred to in describing the step of affixation and FIGS. 23C, 23C' show diagrams to be referred to in describing the step of dicing. In the drawings, FIGS. 23A', 23B', 23C' are plan views shown on the right side while FIGS. 23A, 23B, 23C are cross sectional views cut along the respective cutting lines and shown on the left side. In the drawings, IC connecting electrodes 3 and externally connecting electrodes 4 are hot shown.

BEST MODES TO IMPLEMENT THE INVENTION

Figure 2A:
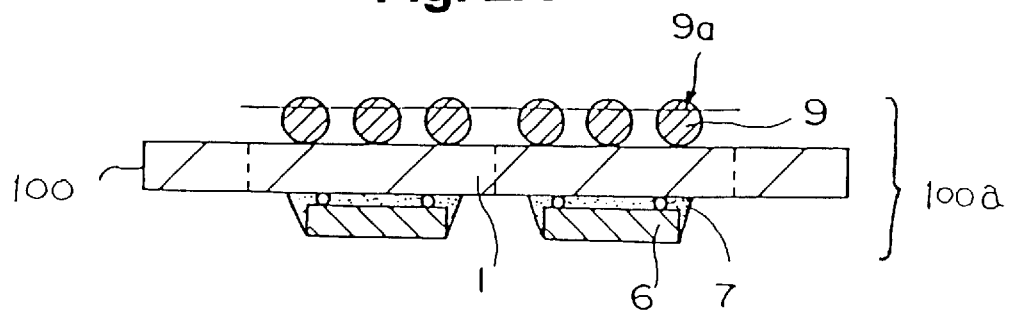

Hereinafter, embodiments of the invention will be described by referring to the drawings. The drawings merely schematically show the size and shape of each of the components and the geometrical relation among them so as to understand the invention. Thus, the present invention is not intended to be limited to these drawings.

Figure 22A:
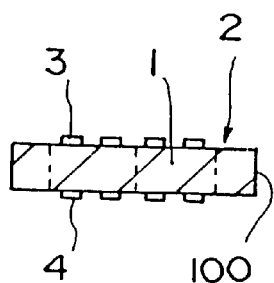
Figure 22A:
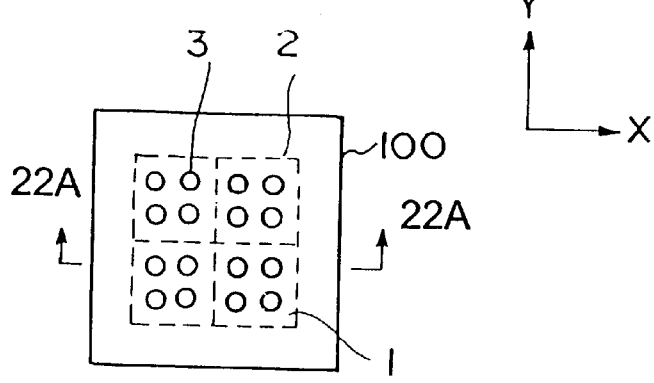
Figure 22B:
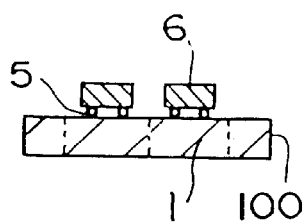
Figure 22B:
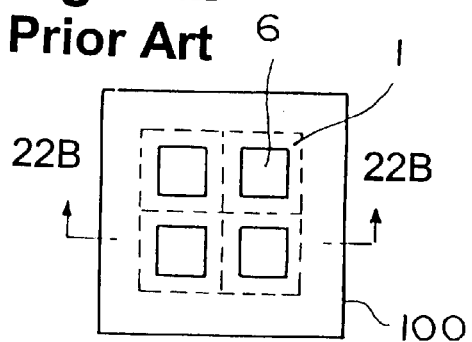
Figure 22C:
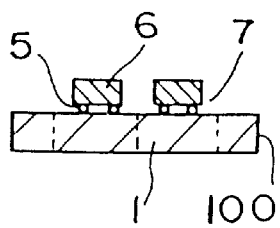
Figure 22C:
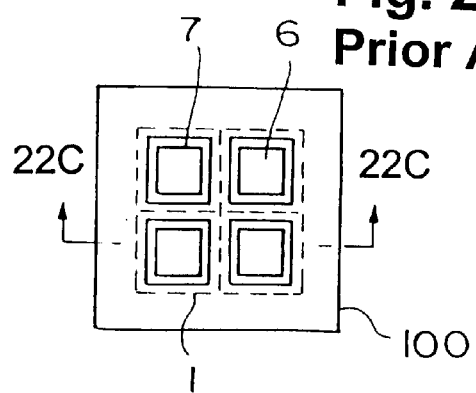

In the following process for manufacturing semiconductor packages as described in the embodiments, the steps of forming circuit substrates, the step of mounting IC's and the step of encapsulating by using resin will be substantially the same as the conventional steps already described by referring to FIGS. 22A–22C'. Accordingly, these steps will not be discussed.

FIRST EMBODIMENT

Step of Forming Electrodes

The first embodiment will now be described by commencing with a discussion of the step of forming electrodes. In the process for manufacturing the semiconductor packages in accordance with the first embodiment, the step of forming electrodes will follow the step of resin encapsulation. In the course of this step of forming the electrodes, before circuit substrates 1 are obtained by dividing circuit substrate aggregation 100, solder balls are positioned on the externally connecting electrode 4 formed on the back surface of each of circuit substrate 1 and subjected to a reflow processing, thereby forming protruded solder ball electrodes 9 as shown in FIG. 1A.

The composition of the solder balls is, as expressed in weight percentage, 40% of Pb and 60% of Sn with the melting point being at 180° C. The composition of the solder bumps used to mount IC chips 6 is, as expressed in weight percentage, 90% of Pb and 10% of Sn with the melting point being at 250° C., which is different from that of the solder balls.

Attaching Step

Then, the attaching step is performed. In this attaching step, package body 100a formed as the result of the steps of forming circuit substrates, mounting IC's and encapsulating by using resin is attached to a standard member. In the first embodiment, as shown in FIGS. 1B, 1B', package body 100a is attached to standard member (for example, dicing tape) 8 with the side on which solder ball electrodes 9 are formed being directed to the standard member.

In the attaching step, it is preferable for package body 100a to be secured to standard member 8 by means of a fixing means such as an adhesive (including a PSA (pressure-sensitive adhesive) tape). For this adhesive, for example, thermally exfoliated "Elep-holder pressure sensitive type dicing tape SPV-224" (product name) manufactured by Nitto Denko Corporation is used.

Also, ultraviolet ray reactive type resin may be used as an adhesive agent, which can be, for example, UV tape "UE-2091J" (product name) manufactured by Nitto Denko Corporation. This UV tape may be used as two-side adhesive. Upon being radiated by ultraviolet rays, the adhesion provided by this tape will drastically be decreased so that it will be readily detached. Alternatively, a thermally reactive type resin or a solvent reactive type resin may be used.

Also, in the affixation step, package body 100a may be attached to standard member 8 by vacuuming.

The surface of package body 100a on which solder ball electrodes 9 are formed, or the back surface of integrated circuit substrate 100, is not planar because of the formation of the solder ball electrodes 9. Thus, in order to surely attach package body 100a to standard member 8, it is more preferable to planarize the back surface of this integrated circuit substrate 100 before attaching it to standard member 8.

An exemplary method of planarizing the back surface of integrated circuit substrate 100 in the affixation step of this embodiment will now be explained by proposing the following first to fifth steps.

(First Exemplary Step)

In the first exemplary step, the top of each of solder ball electrodes 9 is planarized to the same height in the planarization process. In the planarizing process, the top portion of each of solder ball electrodes 9 is cut off so as to achieve the planarized level shown in FIG. 2A. When such a top portion is removed, a predetermined amount of the top portions is polished off by means of a polishing means such as a grinder, so that planarized surface 9a is formed on each of the top portions.

Then, in the following attaching step, planarized surface 9a is attached to standard member 8 by means of an adhesive (including adhesive tape) or vacuum method.

(Second Exemplary Step)

Figure 2B:
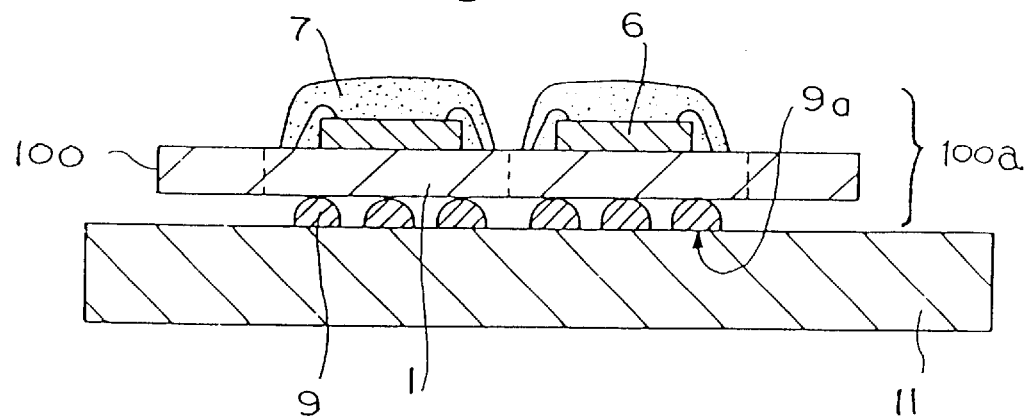

In the second exemplary step, the top of each of solder ball electrodes 9 is planarized to the same height in the planarization. In the planarizing process, the top portions of each of solder ball electrodes 9 is heated so as to achieve the planarized level shown in FIG. 2B. When the top portions are heated, the surface of package body 100a on which the solder ball electrodes are formed is attached to heating plate 11. Then, by maintaining this heating plate at a predetermined temperature, a certain amount of the top portions of solder ball electrodes 9 are melted so that planarized surface 9a is formed.

Then, in the following attaching step, planarized surface 9a is attached to standard member 8 as in the case of the first exemplary step.

(Third Exemplary Step)

Figure 3A:
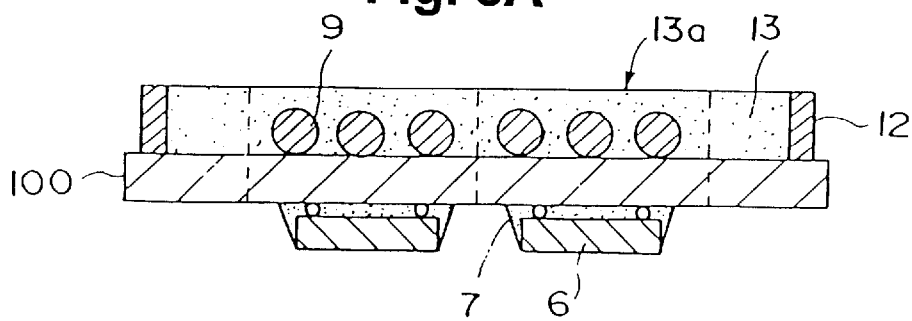

In the third exemplary step, solder ball electrodes 9 are buried into resin 13 so that the upper surface of resin 13 forms a planarized surface as shown in FIG. 3A.

In forming a planarized surface, frame member 12 is set on the perimeter of the back surface of integrated circuit substrates 100. This frame member 12 is consisted of metal or plastic member.

Resin 13 is then filled into the area surrounded by frame member 12 on the back surface so that solder ball electrodes 9 are buried in resin 13. In this example, thermally reactive type resin is used as resin 13. By curing the filled resin 13, planarized surface 13a is obtained as the cured upper surface of resin 13.

In the following affixation step, planarized surface 13a is secured to a standard member by means of adhesive or vacuum attraction.

(Fourth Exemplary Step)

In the fourth exemplary step, solder ball electrodes 9 are buried in a resin so that the upper surface of the resin will form a planarized surface. In forming a planarized surface, solder ball electrodes 9 are buried in the resin by the screen printing method. A metal mask "T-31" (product name) manufactured by Asahi Kaken Corporation is used for the screen printing. The resin is hardened at the temperature of about 130° C.

In the following affixation step, the planarized surface is attached to standard member 8 as in the case of the third exemplary step.

(Fifth Exemplary Step)

In the fifth exemplary step, frame member 12a is set on main surface 8a of standard member 8. The combination of main surface 8a and frame member 12a will form a bath. Standard member 8 is mounted on Peltier element 14.

Then, material layer 15 is formed to be surrounded by frame member 12a on this main surface 8a, which reversibly changes into a solid state or a liquid state depending upon temperature. The material used for material layer 15 is water in this case.

Figure 3B:
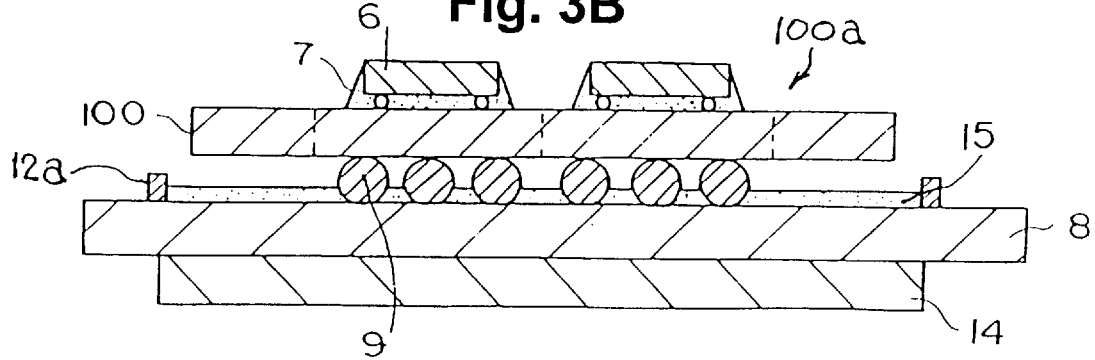

At least a portion of solder ball electrodes 9 including the top thereof is immersed into liquid material layer 15 as shown in FIG. 3B.

Further, material layer 15 is changed into a solid state while a portion of solder ball electrodes 9 is immersed therein. Water is frozen into ice by using Peltier element to cool down the material layer to a temperature below the freezing point. As the result, package body 100a is fixed to standard member 8 with water as an adhesive.

The above described manner allows the planarization and affixation to be performed in a single step in the fifth exemplary step.

After the cutting step which will later be explained in more details, by using Peltier element 14 to heat up the material layer to a temperature above the freezing point, the ice is melted. Thus, completed semiconductor package 10 obtained by dividing package body 100 is detached form standard member 8.

Although water is used as material layer 15 in the fifth embodiment, the material for the material layer is not limited to water. For example, a wax such as commercially available "apieson" may also be used. Wax, which is in a solid state at a room temperature, becomes liquid by heating it to a higher temperature.

Cutting Step

The cutting step is now performed on the package body attached to standard member 8 by either of the first to fifth exemplary steps described above. In the cutting step, package body 100a is diced into circuit substrates 1 as shown in FIG. 1C and 1C'.

In this case, when the cutting step starts, standard member 8 to which package body 100a is attached is set to a dicing apparatus (not shown). As the dicing apparatus, "DFD-640" (product name) manufactured by Disco Corporation is used for example. And as the dicing blade, "NBC-ZB109OS3" (product name) is used which has the width of 0.1 mm and diameter of 52 mm. This dicing blade is rotated 3000 rotations per minute and moved 50 mm per second with respect to the standard member. Pure water is supplied to the dicing interface at the rate of 1.5 liter per minute, so that it will cool down the interface and remove the particles.

When solder ball electrodes 9 are immersed into a resin in the affixation step, the resin is also diced together with said package body. After the cutting step, completed semiconductor package 100a is detached from standard member 8. Then, diced package body 100a is separated into individual substrates 1

The adhesive is then dissolved by means of solution and circuit substrate 1 is detached from standard member 8, thereby obtaining completed semiconductor package 10 as shown in FIG. 1D and 1D'.

When solder ball electrodes 9 are attached to standard member 8 by means of an adhesive, the completed semiconductor package is washed with a washing agent after the exfoliation so as to remove the remaining adhesive. As the washing agent, "Clean Through" (product name) manufactured by Kao Corporation is used for example. After the cleaning by the washing agent, the package will be further washed with pure water. Then, the completed semiconductor package is dried in an oven.

Here, the dicing order in the cutting step will now be described by referring to FIG. 4, which is a plan view of the integrated circuit substrate. On integrated circuit substrate 100, a circuit pattern is formed for the CSP's of a plurality of circuit substrates by the electro-plating method. This circuit pattern comprises common electrodes 16 and 16a, branched wiring 16b and circuit pattern 16c for CSP's . Two common electrodes 16 extend along the X direction. Further, common electrodes 16a extend in the Y direction by connecting the two common electrodes 16. Circuit patterns 16c are arranged to extend from both sides of each common electrode 16a. Common electrode 16a and circuit pattern 16c are connected via a branched wiring 16b.

After package body 100a is formed by using this integrated circuit substrate 100, this body is diced along the dicing lines indicated by dotted lines A to K and (1) to (5).

Since the distance between the dicing lines in the portions including common electrodes 16a in the Y direction (between B and C, E and F, and I and J) is smaller than that in other portions (A and B, C and D, F and G, H and I, and J and K). In case the distance between the dicing lines is small or in case the dicing interval is narrow, the affixation to the standard member is weaker than in other cases because the area is smaller. Thus, if the dicing is performed from A to K in the Y direction, the substrate including common electrodes 16a in the Y direction may be deformed or the dicing line may deviate from the intended dicing lines.

Therefore, in this embodiment, when the dicing is performed along the dicing lines extending in the Y direction, the dicing is performed in the order of A, B, D, E, G, H, I, K, C, F and J. If the dicing is performed in this order, since the dicing lines, the distance between which is small, will not be continuously diced, deformations of the substrates and deviations from the dicing lines will not occur.

When the dicing is performed along the dicing lines along the X direction, the dicing is performed in the order of (1) to (5).

SECOND EMBODIMENT

The second embodiment of the invention will now be described. In the cutting step, the separation areas other than circuit substrates 1 in integrated circuit substrate 100, for example manufacturing blank areas (margin for fabricating) are cut into separate pieces. In the separation areas, however, no solder balls 9 are formed. Thus, these separation areas may not be attached to standard member 8 in some cases. In such cases, the separated pieces of the separation areas will move about in the dicing machines, which may damage the dicing blades or IC chips. Thus, in the method of manufacturing the semiconductor packages in the second embodiment, spacers are formed in the separation areas on the back surface of integrated circuit substrate 100 and the separation areas are attached to standard member 8 through these spacers.

Figure 5A:
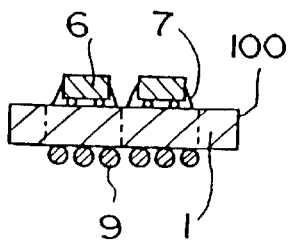
FIGS. 5A–5D' relate to a second embodiment of the invention wherein FIGS. 5A, 5A' show diagrams to be referred to in describing the step of forming electrodes, FIGS. 5B, 5B' show diagrams to be referred to in describing the first exemplary step of forming spacers, FIGS. 5C, 5C' show diagrams to be referred to in describing the step of affixation and FIGS. 5D, 5D' show diagrams to be referred to in describing the step of dicing.
Figure 5A:
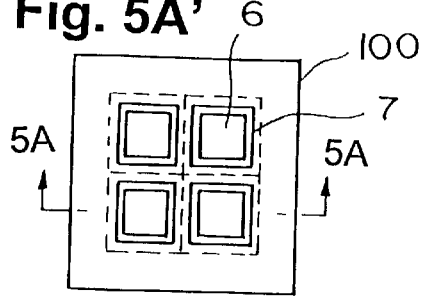

In the method of manufacturing the semiconductor packages in accordance with the second embodiment, the step of forming electrodes is performed after the step of resin encapsulation. In this step of forming the electrodes, just as in the case in accordance with the first embodiment, solder ball electrodes 9 are formed as protruded electrodes as shown in FIG. 5A.

Figure 5B:
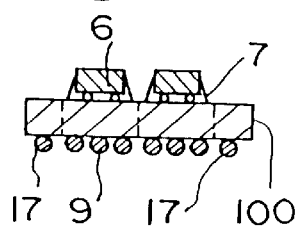
Figure 5B:
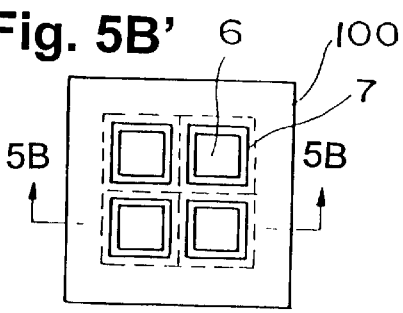
Figure 5C:
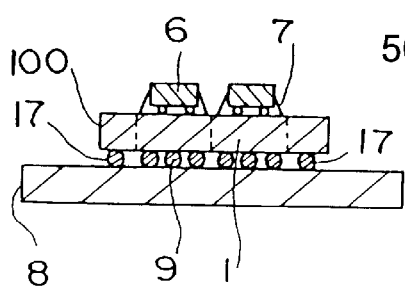
Figure 5C:
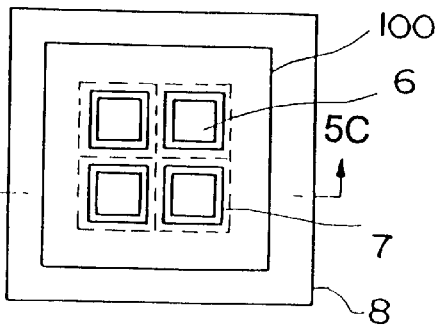
Figure 5D:
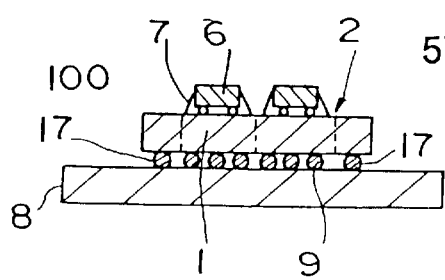
Figure 5D:
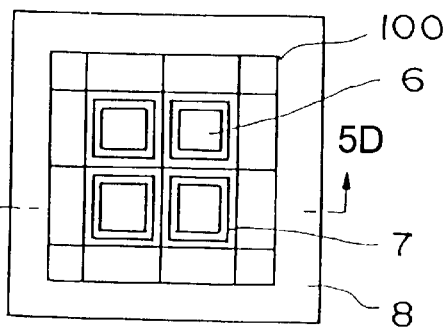

Then, in this embodiment, the step of forming spacers is performed before the step of affixation. In the step of forming the spacers, spacers 17 are formed, as shown in FIG. 5B, on the separation areas of the back surface of integrated circuit substrate 100 which are cut off from circuit substrate 1 In this case, spacers 17 are formed for the following first to third exemplary steps on all the individual pieces of manufacturing blank areas 1a.

The height of spacers 17 is set as being substantially the same as solder ball electrodes 9. This is because it is impossible for the separation areas to be fixed to the standard members if the spacers are too low.

If there exists a defective circuit substrate on which no protruded electrodes are formed, spacers 17 are formed on each of the defective circuit substrate areas.

(First Exemplary Step)

In the first exemplary step, as shown in FIG. 5B, the material used for spacers 17 will be the same as that of solder ball electrodes 9. In a manner similar to how solder ball electrodes 9 are formed, solder balls (not shown) will be placed on the blank area and subjected to a reflow processing, so that the spacers will be formed.

It is preferable for spacers 17 to be formed together with solder ball electrodes 9 during the step of forming the electrodes.

(Second Exemplary Step)

Figure 6A:
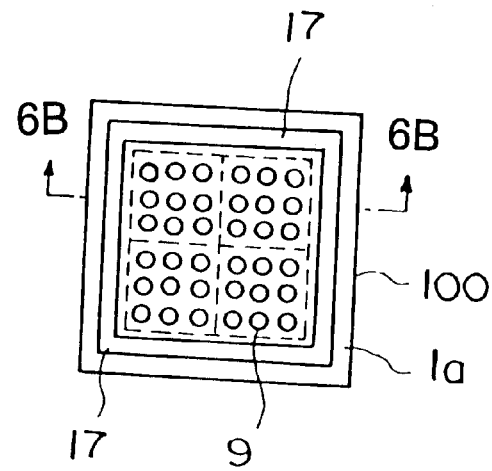
Figure 6B:
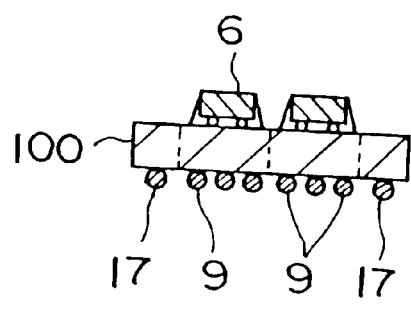

In the second step, as shown in FIGS. 6A and 6B, spacers are formed by hardening the resin. Spacers 17 are, as shown in FIG. 6B, placed in a two-dimensional linear pattern for surrounding the area that will be circuit substrate 1 on the manufacturing blank area 1a of the back surface of integrated circuit substrate 100.

(Third Exemplary Step)

Figure 7A:
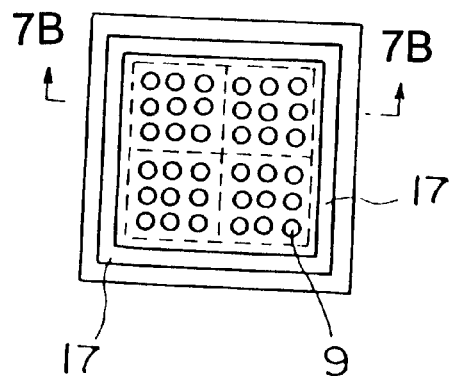
Figure 7B:
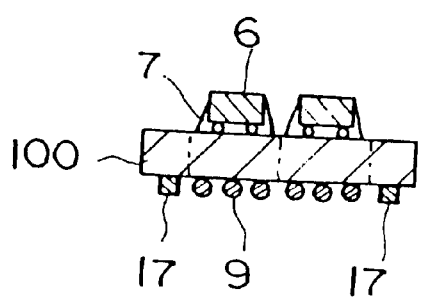

In the third exemplary step, as shown in FIG. 7A, a member whose cross section is rectangular is used as spacers 17. Spacers 17 are, as shown in FIG. 7B, placed in a two-dimensional linear pattern for surrounding the area that will be cut as circuit substrate 1 on the manufacturing blank area 1a of the back surface of integrated circuit substrate 100.

Affixation Step

Next, an affixation step is, as in the case of the first embodiment, performed to package body 100a on which spacers 17 have been formed in accordance with one of the first to third steps described above. In this affixation step, in accordance with this embodiment, a separation area is affixed to standard member 8 via spacers 17.

Cutting Step

Then, a cutting step is, as in the case of the first embodiment, performed. In this embodiment, during the dicing step, the separation area is fixed to standard member 8. Thus, it can be avoided for the cut off separation area to jump toward the dicing blade and damage it.

THIRD EMBODIMENT

In the method of manufacturing the semiconductor packages in accordance with the third embodiment, the steps up to the step of forming the electrodes are the same as in the case of the first embodiment. Thus, the step of forming the electrodes will not be explained in this embodiment.

Affixation Step

Figure 8A:
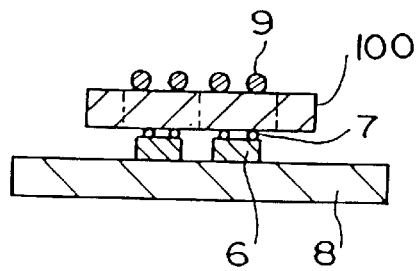
Figure 8A:
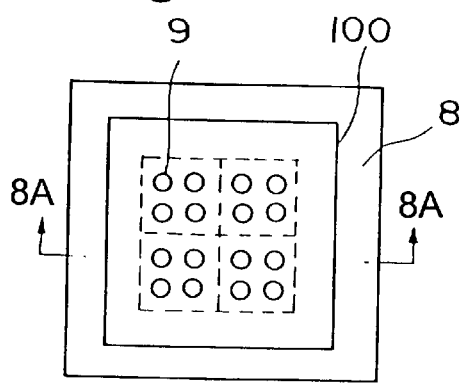
Figure 8B:
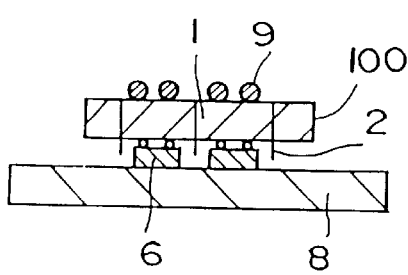
Figure 8B:
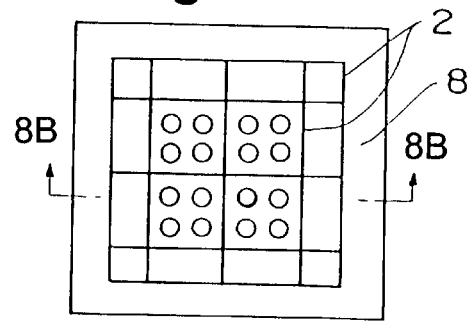

In the third embodiment, as in the case of the first embodiment, an affixation step is performed after the step of forming the electrodes. In the affixation step, package body 100a which is formed as the result of the steps of forming the substrate, mounting IC's, encapsulating with resin and forming electrodes is affixed to the standard member. In the third embodiment, as shown in FIG. 8B, the side of package body 100a on which IC chips 6 are formed is affixed to the standard member.

In this affixation step, package body 100a is affixed to the standard member by using such a fixation means as an adhesive agent (including an adhesive tape), which is the same as in the case of the first embodiment.

Even though any adhesive agent is left on the upper side of IC chips 6 which are detached from standard member 8, the performance of the IC chips will not be adversely affected.

The side of the package body 100a on which the IC chips are mounted or the main surface of integrated circuit substrate 100 is not planar. In particular, the thickness of the encapsulating resin on the upper side of each IC chip is not the same. Thus, in order for package body 100a to be firmly affixed to standard member 8, it is preferable for the main surface of this integrated circuit substrate 100 to be better planarized so as to be better affixed to standard member 8.

Thus, in this embodiment, during the affixation step, the back surface of integrated circuit substrate 100 will be planarized in accordance with the following first to fifth exemplary steps, which will be described below.

(First Exemplary Step)

Figure 9A:
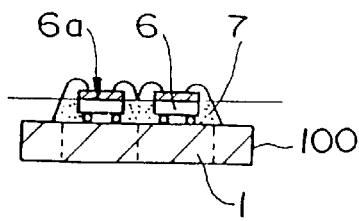
Figure 9B:
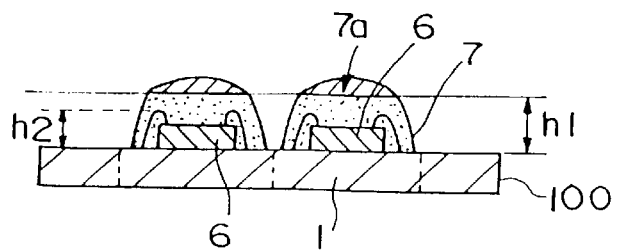

In the first exemplary step, the upper surface of each of IC chips 6 is planarized to the same height during the planarization step. In the planarization, the upper surface of each of IC chips is, as shown in FIG. 9A, polished together with encapsulating resin 7 so that the upper surface will be planarized. The height from the main surface of integrated circuit substrate 100 to the planarized upper surface 6a, however, must be higher than that from this main surface to the circuit surface of the IC's within IC chips 6.

Then, in the affixation step, the planarized upper surface is affixed to standard member 8 by means of an adhesive agent (including an adhesive tape) or such fixation means as a vacuum attraction device.

(Second Exemplary Step)

In the second exemplary step, the upper surface of each of IC chips 6 is planarized to the same height during the planarization step. In the planarization, the upper surface of the deposited encapsulating resin 7 is polished so that the upper surface will be planarized. However, if IC chips 6 are mounted by using wire bonding, the height h1 from the main surface of integrated circuit substrate 100 to the planarized upper surface 7a must be higher than that from this main surface to the highest point of the wire bonding.

Then, in the affixation step, the planarized upper surface is affixed to standard member 8 as in the case of the first exemplary step.

(Third Exemplary Step)

Figure 10A:
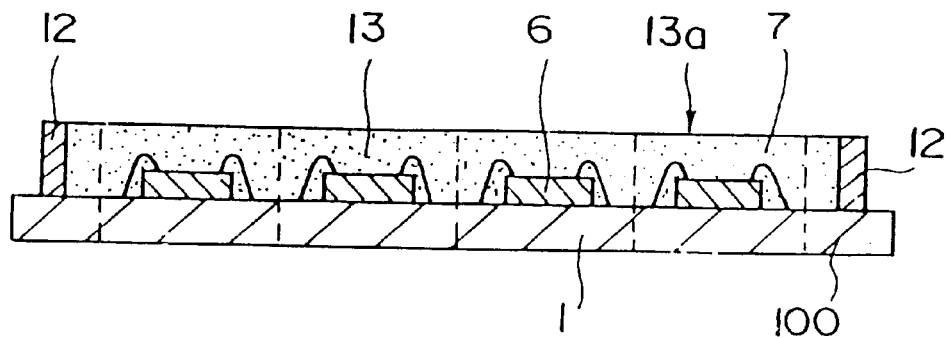

In the third exemplary step, during the step of forming a planarized surface, planar surface 13a is formed as the upper surface 13a of resin 13 as shown in FIG. 10A by burying IC chip 6 by using resin 13. In forming planar surface 13a, frame member 12 is set in the outer perimeter of the main surface of integrated circuit substrate 100. This frame member 12 is composed of a metal or a plastic member.

Then, resin 13 is filled into the region surrounded by frame member 12 on the main surface so that the IC chips are buried. In this case, thermally reactive resin is used. By hardening the filled resin 13, planar surface 13a is formed as the hardened upper surface of resin 13.

Next, in the step of affixing the planar surface, planar surface 13a is affixed to the standard member by means of an adhesive agent or such fixation means as a vacuum attraction device.

(Fourth Exemplary Step)

Figure 10B:
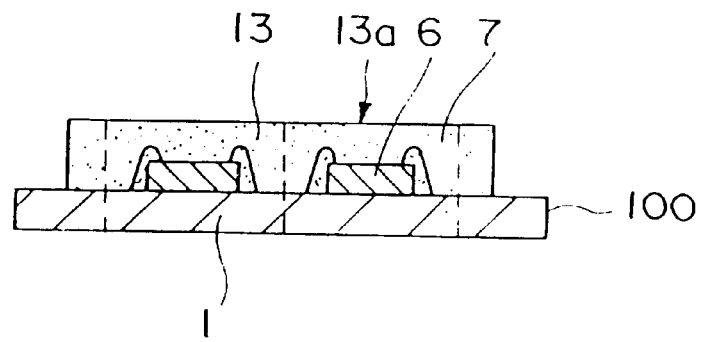
Figure 11:
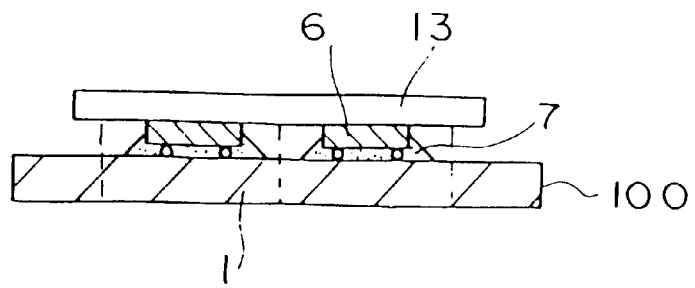
FIG. 11 relates to the third embodiment of the invention and will be referred to in describing the planarization step, showing a cross sectional view to be referred to in describing the fifth exemplary step.

In the fourth exemplary step, during the step of forming a planarized surface, planar surface 13a is formed as the upper surface of resin 13 by burying IC chips 6 by using resin. In forming the planar surface, as shown in FIG. 10B, IC chips 6 are buried in the resin in accordance with the transmold method.

Alternatively, in burying the IC chips in the resin, the screen-print method may also be employed.

Then, in the step of forming the planarized surface, the planar surface is affixed to standard member 8 as in the case of the third exemplary step.

(Fifth Exemplary Step)

In the fifth exemplary step, the first main surface of a planar board is affixed to the upper surface of the deposited encapsulating resin on the IC chips. The planar board used in this case is a metal board having a good thermal conductivity such as an aluminum board, copper board or an alloy comprising copper and tungsten. This planar board also functions as a heat releaser.

Then, a cutting (dicing) step is performed as in the case of the first embodiment.

FOURTH EMBODIMENT

In the cutting step, the separation area such as a manufacturing blank area other than circuit substrate 1 of integrated circuit substrate 100 is also cut off as individual pieces. However, the separation areas do not have solder ball electrodes 9. Thus, the separation area may not be affixed to standard member 8 during the dicing process. In such cases, the pieces cut off by the dicing step jump around in the dicing apparatus. Consequently, the dicing blade and IC chips may be damaged.

Thus, in the method of manufacturing the semiconductor packages in accordance with the fourth embodiment, spacers are formed in the separation area on the main surface of integrated circuit substrate 100 and the separation area will be affixed to standard member 8 via these spacers.

Step of Forming Electrodes

Figure 12A:
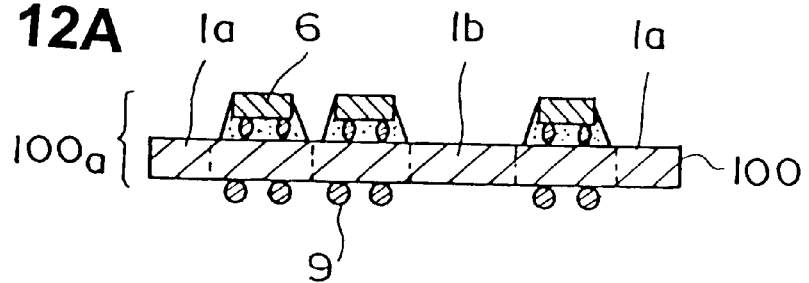

In the method of manufacturing the semiconductor packages in accordance with the fourth embodiment, the step of forming the electrodes follows the step of resin encapsulation. In this step of forming the electrodes, as in the case of the first embodiment, as shown in FIG. 12A, the solder ball electrodes are formed as protruding electrodes.

Step of Forming Spacers

Figure 12B:
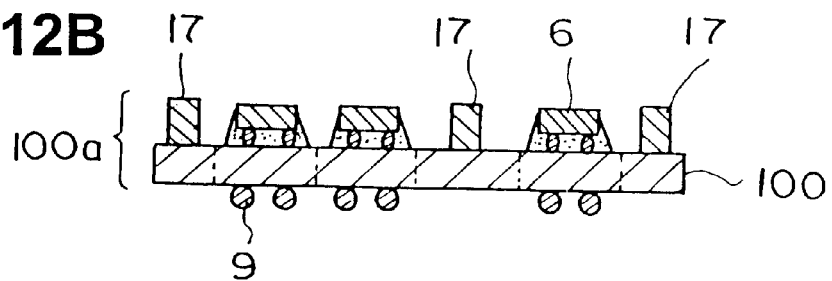
Figure 12C:
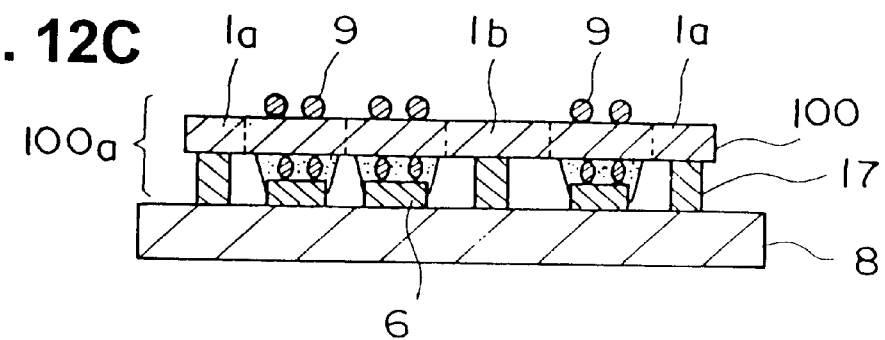
Figure 12D:
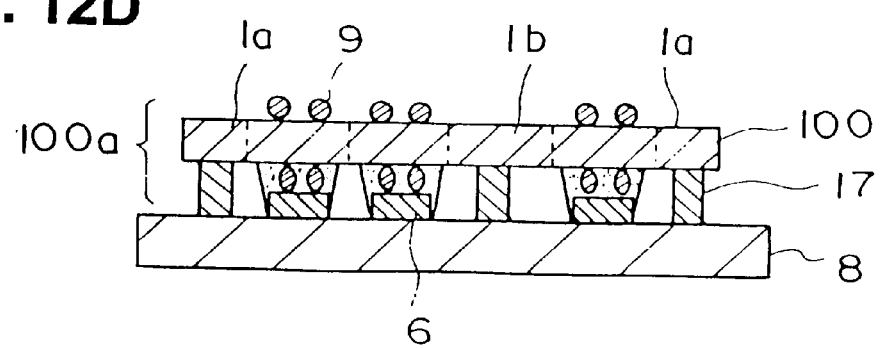

Next, in this embodiment, the step of forming the spacers is performed before the step of affixation. In the step of forming the spacers, spacers 17 are formed on the separation area which will be cut off from circuit substrate 1 in the dicing step on the main surface of integrated circuit substrate 100 as shown in FIG. 12B. In this case, spacers 17 of the following first to third exemplary steps are formed on all the pieces of the manufacturing blank areas 1a and each of the defective circuit substrate area 1b where said protruding electrodes are not formed.

The height of spacers 17 must be the same as the distance between the integrated circuit substrate 100 and standard member 8 when package body 100a is affixed to standard member 8. This is because it is not possible for the separation area to be fixed to the standard member if the spacers are too low.

(First Exemplary Step)

Figure 13A:
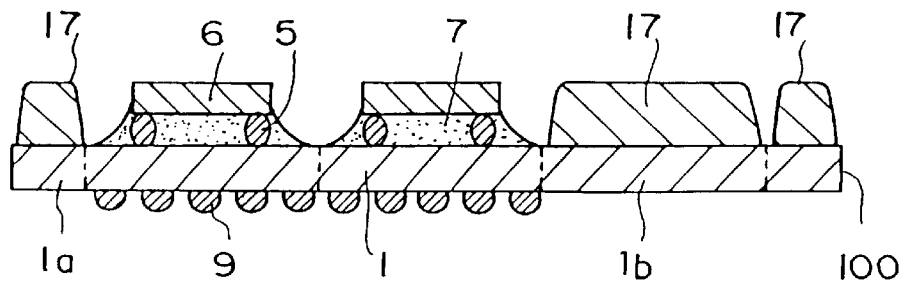
FIGS. 13A and 13B relate to the fourth embodiment of the invention and show cross sectional views of an integrated package body on which spacers are formed.

In the first exemplary step, as shown in FIG. 13A, spacers 17 are formed by hardening the resin. In this case, an appropriate amount of resin is dropped onto manufacturing blank area 1a and defective circuit substrate area 1b. The amount of resin to be dropped must be such that the height of the hardened resin is at least the same height as the distance between integrated circuit substrate 100 and standard member 8.

Figure 13B:
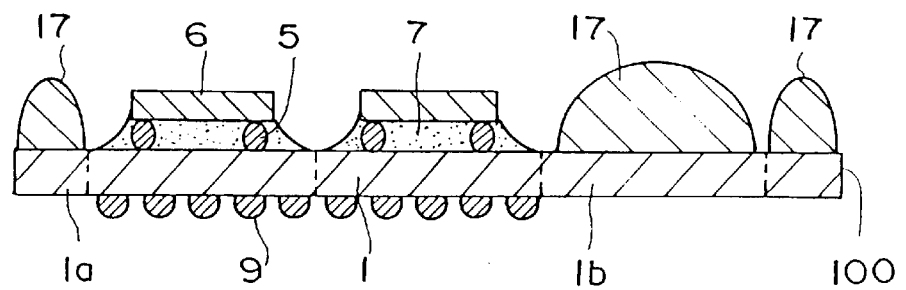

If the height of the hardened resin is higher than this distance as shown in FIG. 13B, the upper surface of the resin is pressed down by, for example, a planar board so that the predetermined height of spacers 17 can be obtained.

Resins such as thermally hardening resin, ultraviolet hardening resin or thermally deformable resin will be used. If a thermally hardening resin is used, the resin is heated to be hardened after the resin is dropped.

(Second Exemplary Step)

Figure 14A:
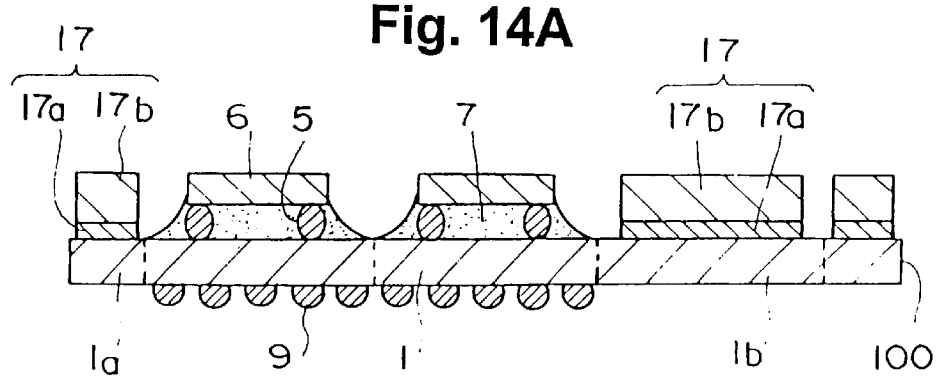

In the second exemplary step, base 17b having adhesive agent 17a is, as shown in FIG. 14A, used as spacers. For base 17b, a board made of a resin or metal will be used. Then, adhesive agent 17a is attached to at least a portion of the both sides or only one side of base 17b. Base 17b is attached to the main surface of integrated circuit substrate 100 using this adhesive agent 17a.

(Third Exemplary Step)

Figure 14B:
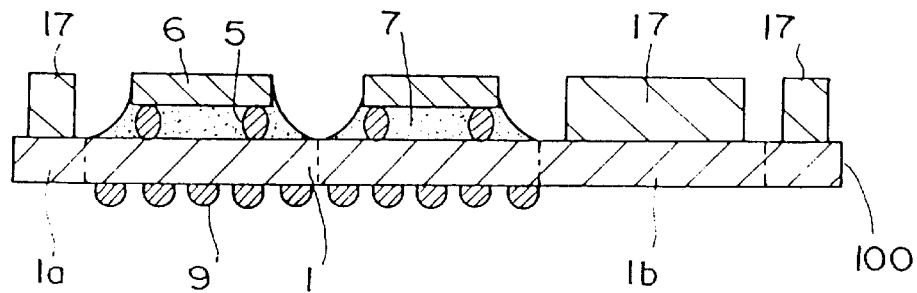

In the third exemplary step, as shown in FIG. 14B, dummy IC chips 17 are formed as spacers 17.

If adhesion is not sufficient between dummy IC chips 17 as the spacers and integrated circuit substrates 100, it is preferable to provide encapsulating resin 7 therebetween.

Affixation Step

Next, an affixation step is performed, as in the case of the first embodiment, to package body 100a on which spacers 17 are formed in accordance with the above described first to third exemplary steps. In the affixation step, in this embodiment, the separation area is affixed to standard member 8 via spacers 17.

Cutting Step

Next, a cutting step is performed as in the case of the first embodiment. In this embodiment, during the dicing process, the separation area is fixed to standard member 8. Thus, it is possible to avoid the cut off separation area from damaging the dicing blade by jumping around.

FIFTH EMBODIMENT

In the method manufacturing the semiconductor packages in accordance with the fifth embodiment, in the affixation step, the side of package body 100a on which the solder ball electrodes 9 are formed as in the case of the first embodiment is vacuum attracted to standard member 8, which will be described below.

In the affixation step, spacers 17 are formed on manufacturing blank area 1a of the back surface of integrated circuit member 100 and on the defective circuit substrate area 1b. In this case, for spacers 17, an attraction member will be used which has an attracting tube inside. Also, dicing tape 20 is affixed on the upper edge of each of solder ball electrodes 9.

The height of spacers 17 must be the sum of the height of solder ball electrodes 9 and the thickness of dicing tape 20. For example, if solder ball electrodes 9 are approximately 0.6 mm high and dicing tape 20 is approximately 0.1 mm thick, then spacers 17 are approximately 0.7 mm.

Figure 15A:
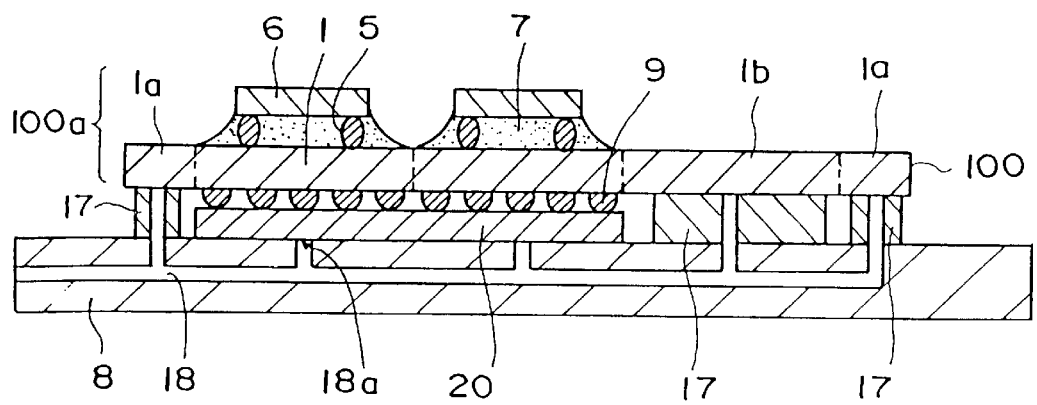

Then, this dicing tape 20 and spacers 17 are vacuum attracted to standard member 8. This standard member 8 has, as shown in FIG. 15A, attracting tube 18 which has attracting openings 18a for the main surface. One end of the attracting tube is connected to a vacuum pump (not shown).

Figure 15B:
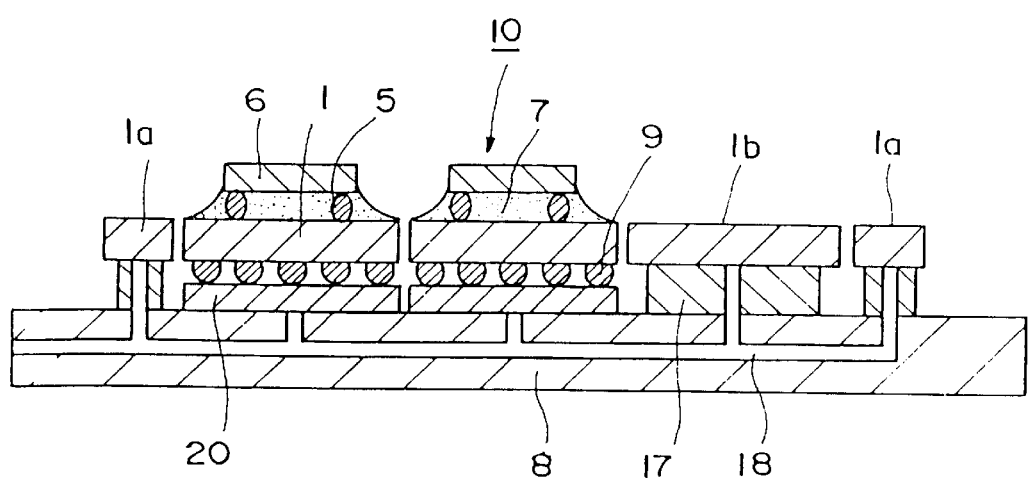

Next, in the cutting step, while package body 100a is vacuum attracted to standard member 8, integrated circuit substrate 100 is, as shown in FIG. 15B, cut by a dicing process.

SIXTH EMBODIMENT

In the method of manufacturing the semiconductor package in accordance with the sixth embodiment, in the affixation step, the side of package body 100a formed as in the case in the first embodiment on which IC chips 6 are mounted is vacuum attracted to standard member 8, which will be explained below.

In the affixation step, spacers 17 are formed on manufacturing blank area 1a of the main surface of integrated circuit member 100 and on the defective circuit substrate area 1b. In this case, for spacers 17, an attraction member will be used which has an attracting tube inside. Also, dicing tape 20 is affixed on the upper edge of each of solder ball electrodes 9.

The height of spacers 17 must be the sum of the height of IC chips 6 the thickness of IC connecting electrodes 3 and the thickness of dicing tape 20. For example, if IC chips 6 are approximately 0.625 mm high, IC connecting electrodes 3 are approximately 0.1 mm thick and dicing tape 20 is approximately 0.1 mm thick, then spacers 17 are approximately 0.825 mm.

Figure 16A:
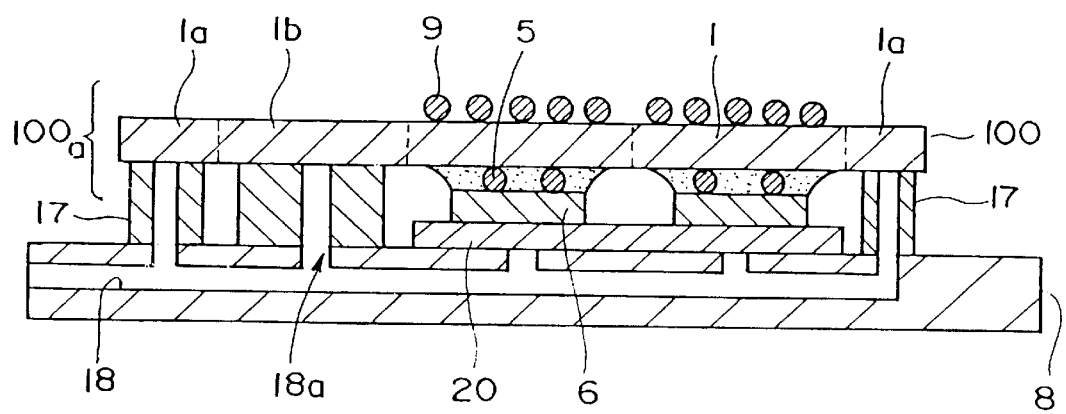

Then, this dicing tape 20 and spacers 17 are vacuum attracted to standard member 8. This standard member 8 has, as shown in FIG. 16A, attracting tube 18 which has attracting opening 18a for the main surface. One end of the attracting tube is connected to a vacuum pump (not shown).

Figure 16B:
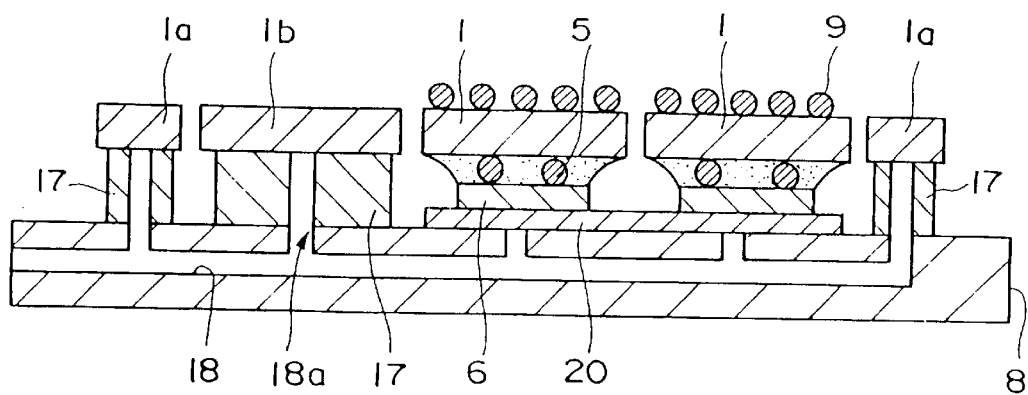

Next, in the cutting step, while package body 100a is vacuum attracted to standard member 8, integrated circuit substrate 100 is, as shown in FIG. 16B, cut by a dicing process.

SEVENTH EMBODIMENT

In the seventh embodiment, an example of integrated circuit substrate 100 used for manufacturing the semiconductor packages will be given.

Integrated circuit substrate 100 in the seventh embodiment is divided into a plurality of circuit substrates 1. This integrated circuit substrate 100 has, as shown in FIG. 17, manufacturing blank areas 1a on the opposed two sides F2 and F4 of four peripheral sides surrounding itself. Thus, the remaining two sides F1 and F3 of this integrated circuit substrate do not have manufacturing blank areas. In other words, these two remaining sides are the sides of circuit substrate 1.

Integrated circuit substrate 100 is normally formed from a substrate material by die-cut molding. Thus, the edges of a conventional integrated circuit substrate are shear planes die-cut with a mold. Since the shear plane has a coarse surface, it is not preferable as an edge of the circuit substrate.

Thus, in this embodiment, in order to form the two sides F1 and F3 which will be the sides of the circuit substrates, the same cutting method as used to divide integrated circuit substrate 100 into a plurality of circuit substrates 1 is used. The dicing method is, for example, is preferable. If the dicing method is employed, these two sides F1 and F3 may be used as the edges of circuit substrate 1.

Further, if the dicing method is used, the edges will be accurately positioned as well as they have a smooth surface. The blank area required for dicing is extremely narrow compared to that for other cutting method.

As already discussed above, the integrated circuit substrate is formed by cutting the substrate material. This substrate material is formed by cutting an original board with a predetermined size. The original board is normally 1 m wide. Substrate materials are formed by equally dividing this width of 1 m. If 1 m width is equally divided into 2, 3, 4 and 5 parts, the obtained width will be approximately 500, 330, 250 and 200 mm. If the manufacturing blank areas on the both sides are subtracted from these divided widths, the remaining effective value of the divided width will be approximately 490, 320, 240 and 190 mm.

These effective values of the divided widths will be further equally divided and subtracted by the cutting blank areas, then becoming the width of the integrated circuit substrate.

The width of the substrate material depends on the number of the dividing of an original board in a predetermined size. Thus, since the area of the unused region, the width of which is smaller than that of integrated circuit substrate, is large in some cases, a quite large amount of material has been wasted in the prior art.

Thus, in this embodiment, in order to minimize the waste of the material, the common length (A) of the two sides F1 and F3 of all the four sides of integrated circuit substrate 100 is shared by different dividing number (such as K1, K2). In other words, the common length (A) satisfies the conditions such that supposing one side of a specified size substrate has a length (L), a length M1 obtained by dividing L by K1 (M1=L/K1) and a length M2 obtained by dividing L by K2 (M2=L/K2) are respectively a product of the common length (A) multiplied by an integer.

This is preferably 76 mm to 81 mm wide depending upon the relationship between the number of integrated circuit substrates 100 taken from the substrate material and the width of the integrated circuit material.

Thus, if this shared common length is employed, the manufacturing processes may be readily automated, thereby improving the productivity of the integrated circuit substrate. Consequently, since the manufacturing cost of the integrated circuit substrate can be lowered, the manufacturing cost of the semiconductor packaged may also be lowered.

Further, this shared common length is longer than the width of the conventional normal integrated circuit substrate (56 mm). Thus, by employing this shared common length, the dividing number by which the substrate material is divided into the integrated circuit substrates may hopefully be fewer than in the conventional cases. If this dividing number may be smaller, the blank area for the division will also be smaller. Therefore, by employing the shared common length, the substrate material can be more efficiently used.

Table 1 below shows the widths of the integrated circuit substrates when the dicing method is used. The cutting blank area in this case is 0.2 mm.

TABLE 1

| | (mm) | | | |
|---|---|---|---|---|
| | | b | | |
| n | 200 | 250 | 330 | 500 |
| 1 | 190.0 | 240.0 | 320.0 | 490.0 |
| 2 | 94.9 | 119.9 | 159.9 | 244.9 |
| 3 | 63.2 | 79.9 | 106.5 | 163.2 |
| 4 | 47.4 | 59.9 | 79.9 | 122.4 |
| 5 | 37.8 | 47.8 | 63.8 | 97.8 |
| 6 | 31.5 | 39.8 | 53.2 | 81.5 |
| 7 | 27.0 | 34.1 | 45.5 | 69.8 |
| 8 | 23.6 | 29.8 | 39.8 | 61.1 |
| 9 | 20.9 | 26.5 | 35.4 | 54.3 |
| 10 | 18.8 | 23.8 | 31.8 | 48.8 |

In the Table 1, b represents the divided length of the substrate material and n represents how many the divided length is further divided into. In Table 1, when the original board of predetermined (standardized) size (1 m wide) is divided into two and divided length b is 500 mm, the width W2 of the integrated circuit substrate in the case where six (=n) is taken is 81.5 mm. Similarly, when the original board is divided into three and divided width b is 330 mm, W2 is 79.9 mm if n is four. When the original board is divided into four and divided width b is 250 mm, W2 is 79.9 mm if n is three.

Table 2 below shows the widths of the integrated circuit substrates when the routing method is used as the cutting method. The cutting blank area in this routing is 2 mm.

TABLE 2

| | (mm) | | | |
|---|---|---|---|---|
| | | b | | |
| n | 200 | 250 | 330 | 500 |
| 1 | 190.0 | 240.0 | 320.0 | 490.0 |
| 2 | 94.0 | 119.0 | 150.0 | 244.0 |
| 3 | 62.0 | 78.7 | 105.3 | 162.0 |
| 4 | 46.0 | 58.5 | 78.5 | 121.0 |
| 5 | 36.4 | 46.4 | 62.4 | 96.4 |
| 6 | 30.0 | 38.3 | 51.7 | 80.0 |
| 7 | 25.4 | 32.6 | 44.0 | 68.3 |
| 8 | 22.0 | 28.3 | 38.3 | 59.5 |
| 9 | 19.3 | 24.9 | 33.8 | 52.7 |
| 10 | 17.2 | 22.2 | 30.2 | 47.2 |

In the Table 2, b represents the divided length of the substrate material and n represents how many the divided length is further divided into. In Table 2, when the original board of a predetermined (standardized) size (1 m wide) is divided into two and divided length b is 500 mm, the width W2 of the integrated circuit substrate in the case where six (=n) is taken is 80.0 mm. Similarly, when the original board is divided into three and divided width b is 330 mm, W2 is 78.5 mm if n is four. When the original board is divided into four and divided width b is 250 mm, W2 is 78.7 mm if n is three.

Table 3 below shows the widths of the integrated circuit substrates when the routing method is used as the cutting method and cutting is performed so that the cutting blank area is 5 mm wide and a tie bar is left. The cutting blank area in this routing is 0.2 mm.

TABLE 3

| | (mm) | | | |
|---|---|---|---|---|
| | | b | | |
| n | 200 | 250 | 330 | 500 |
| 1 | 190.0 | 240.0 | 320.0 | 490.0 |
| 2 | 92.5 | 117.5 | 157.5 | 242.5 |
| 3 | 60.0 | 76.7 | 103.3 | 160.0 |
| 4 | 43.8 | 56.3 | 76.3 | 118.8 |
| 5 | 34.0 | 44.0 | 60.0 | 94.0 |
| 6 | 27.5 | 35.8 | 49.2 | 77.5 |
| 7 | 22.9 | 30.0 | 41.4 | 65.7 |
| 8 | 19.4 | 25.6 | 35.6 | 56.9 |
| 9 | 16.7 | 22.2 | 31.1 | 50.0 |
| 10 | 14.5 | 19.5 | 27.5 | 44.5 |

In Table 3, b represents the divided length of the substrate material and n represents how many the divided length is further divided into. In Table 3, when the original board of a predetermined (standardized) size (1 m wide) is divided into two and divided length b is 500 mm, the width W2 of the integrated circuit substrate in the case where six is taken is 77.5 mm. Similarly, when the original board is divided into three and divided width b is 330 mm, W2 is 76.3 mm if n is four. When the original board is divided into four and divided width b is 250 mm, W2 is 76.7 mm if n is three.

Therefore, from the above Tables 1 to 3, if the width W2 of the integrated circuit substrate is 76 mm to 81 mm, integrated circuit substrate 100 may be cut off so that it will have a common width with respect to a plurality of the divided numbers of the original board.

EIGHTH EMBODIMENT

In this eighth embodiment, the example of the manufacturing semiconductor packages will be described by using the integrated circuit substrate of the seventh embodiment.

Also in FIG. 18, integrated circuit substrate 100 is divided into four circuit substrates 1, which is merely exemplary. This integrated circuit substrate 100 has manufacturing blank areas only on two sides out of four sides on its perimeter, each of which is 5 mm wide.

Step of Forming Circuit Substrate

Figure 18A:
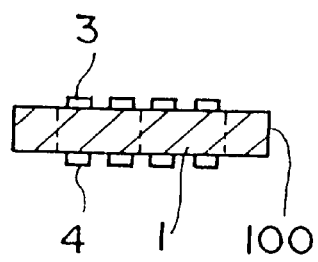
Figure 18A:
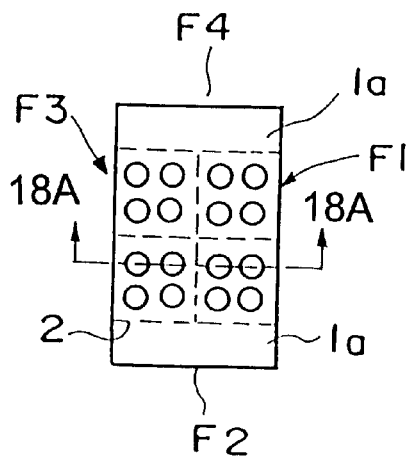

In manufacturing the semiconductor packages, as shown in FIGS. 18A and 18A', in the step of forming the circuit substrates, IC connecting electrodes 3 are formed on the main surface of integrated circuit substrate 100 which will be cut into a plurality of circuit substrates 1 and externally connecting electrodes 4 will be formed on the back surface of this integrated circuit substrate 100. In both cases, these electrodes are arranged for more than one circuit substrate.

Step of Mounting IC Chips

Figure 18B:
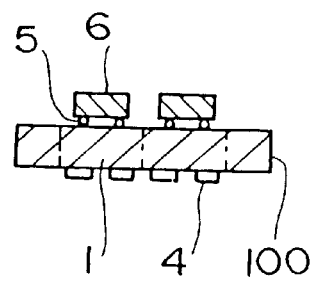
Figure 18B:
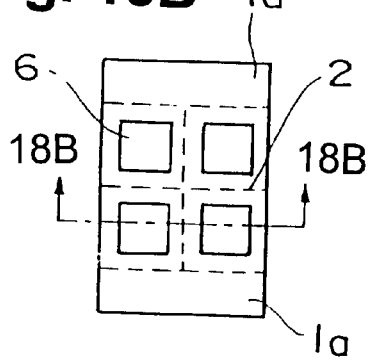

Then, in the step of mounting the IC chips, as shown in FIGS. 18B and 18B', IC chip 6 is mounted on each of circuit substrate 1 on the main surface of integrated circuit substrate 100. Further, IC chips 6 are mounted on integrated circuit substrate 100 by electrically connecting IC connecting electrodes 3 and IC chips 6.

Step of Resin Encapsulation

Figure 18C:
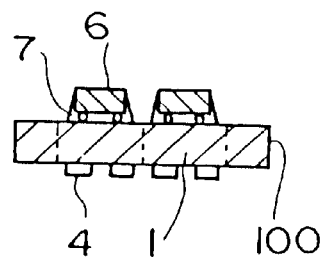
Figure 18C:
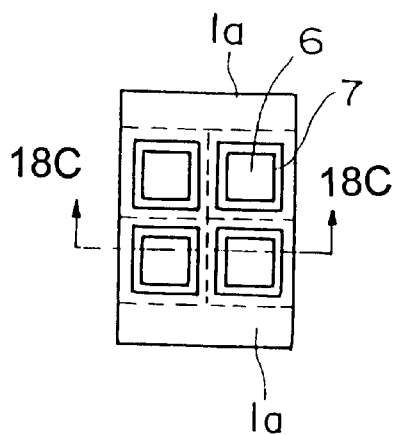

Next, in the step of resin encapsulation, as shown in FIGS. 18C and 18C', the IC chips are encapsulated with resin.

Step of Forming Electrodes

Figure 19A:
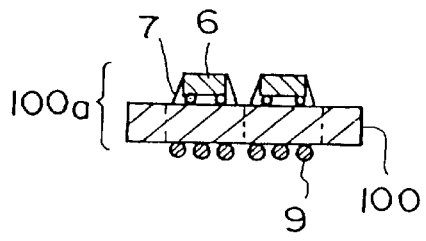
Figure 19A:
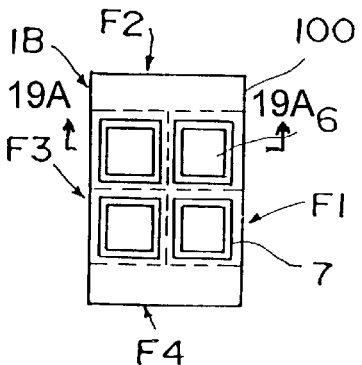

Next, in the step of forming the electrodes, as shown in FIGS. 19A and 19A', solder ball electrodes 9 are formed on externally connecting electrodes 9.

Step of Forming Spacers

Figure 19B:
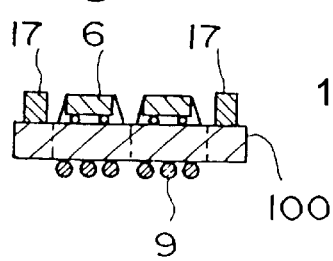
Figure 19B:
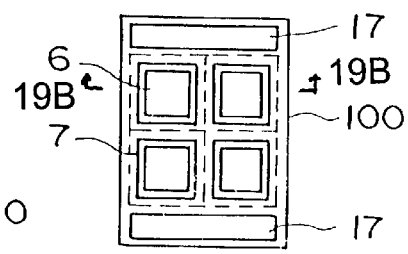

Next, in this embodiment, in the step of forming the spacers, as shown in FIGS. 19B and 19B', spacers 17 are formed on the manufacturing blank areas 1a of the main surface of integrated circuit substrate 100.

In this case, as shown in FIGS. 19B and 19B', spacers 17 are formed as linearly extending on two manufacturing blank areas 1a. The shape of the cross-section of spacers 17 is rectangular.

In the conventional integrated circuit substrates, a frame of the manufacturing blank areas are formed on all the four side of the perimeter. Thus, when the spacers are formed on the conventional manufacturing blank areas, the two-dimensional pattern of the spacers will also be of rectangular frame. In order to form the spacers of two-dimensional frame pattern, a layer that will become spacers will first be formed across the integrated circuit substrate and then the area corresponding to circuit substrate 1 will be removed.

As opposed to this, in this embodiment, since spacers 17 are formed as a simple linear form, the above removal procedure is not necessary. Thus, in this embodiment, spacers 17 are more readily formed than in the conventional cases. Since the above removal procedure is not necessary, the material for spacers 17 is scarcely wasted. Thus, the manufacturing cost can be lowered. Since the removal procedure is not necessary, the present method is suitable for automation of the manufacturing process, thereby improving the productivity.

Affixation Step

Figure 19C:
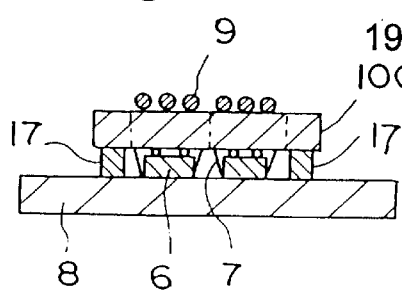
Figure 19C:
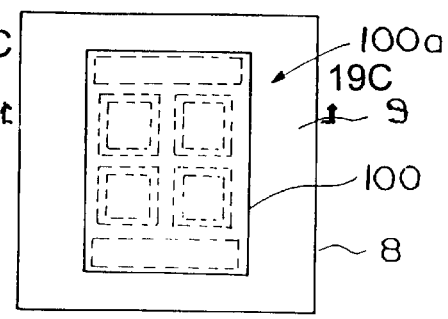

Next, in the affixation step, package body 100a which is formed by the steps of forming the circuit substrates, mounting the IC chips, encapsulating with resin and forming the electrodes is affixed to standard member 8. In this embodiment, as shown in FIGS. 19C and 19C', the side of package body 100a on which IC chips 6 are formed is affixed to standard member 8. Manufacturing blank areas 1a of integrated circuit substrate 100 will be affixed to standard member 8 via spacers 17.

Cutting Step

Figure 19D:
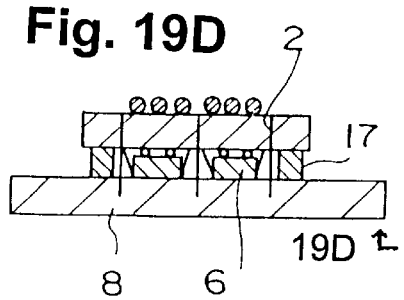
Figure 19D:
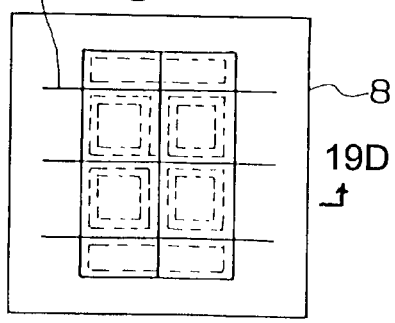
Figure 20:
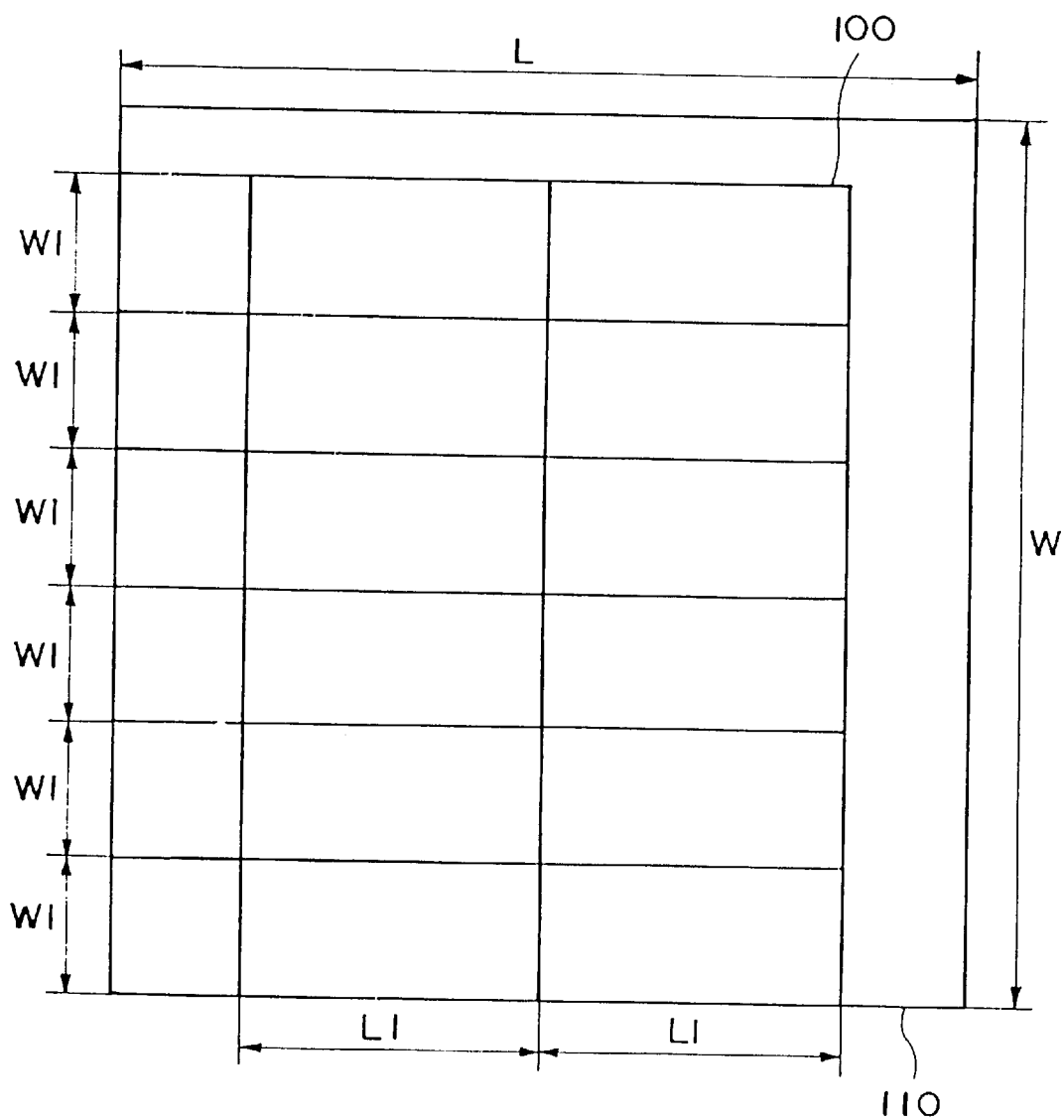
FIG. 20 shows a plan view of a substrate material.
Figure 21:
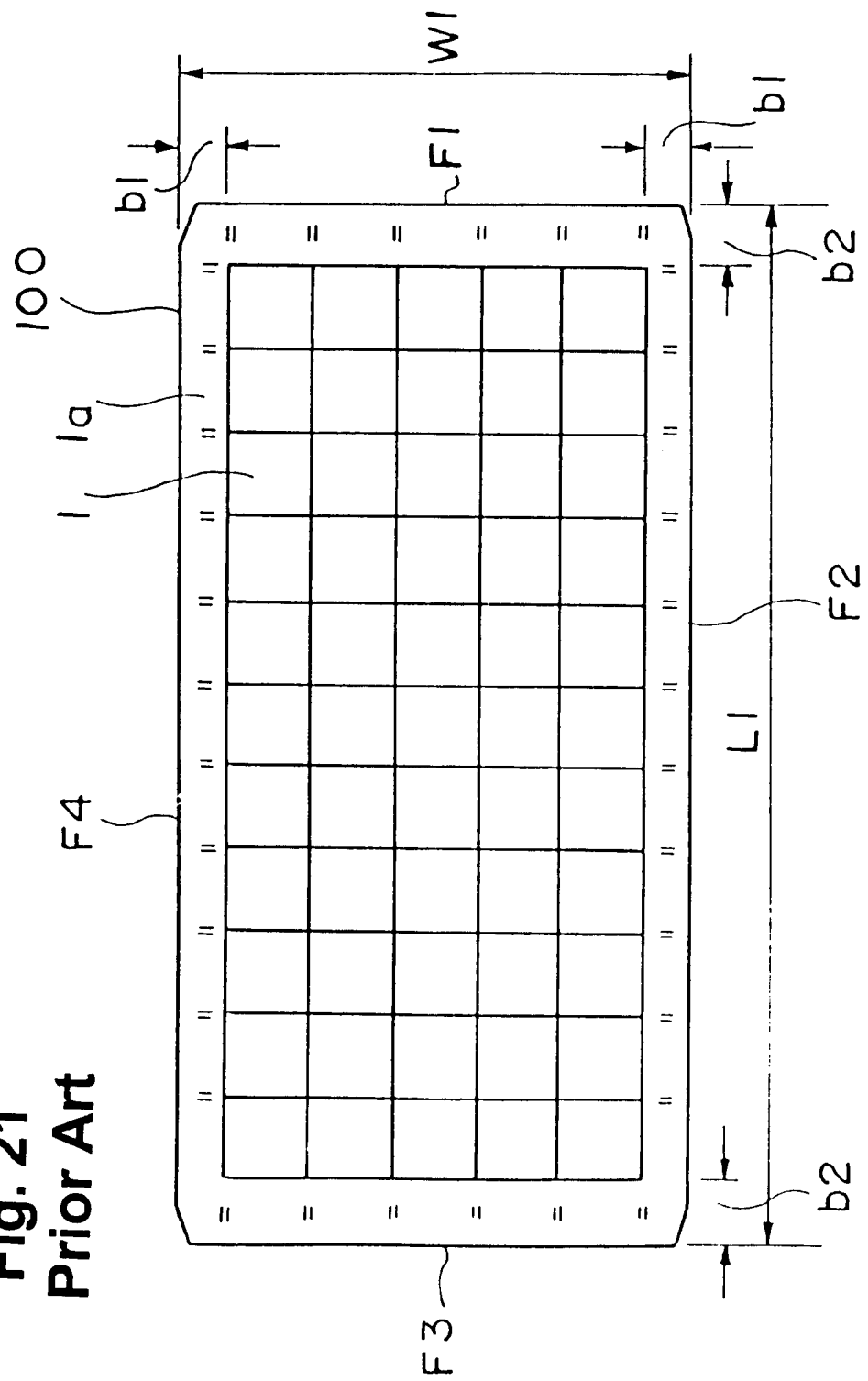
FIG. 21 shows a plan view of a conventional circuit substrate aggregation.

Next, in the cutting step, package body 100 is diced, as shown in FIGS. 19D and 19D' into circuit substrates 1, thereby forming a plurality of completed semiconductor packages each of which surrounds a circuit substrate.

In the above described embodiments, although particular materials are used for forming the elements in the specific situations, a number of modifications and changes are possible to this invention. For example, the step of forming the electrodes follows the step of resin encapsulation in the above described embodiments, the step of forming the electrodes may be performed at any arbitrary moment if it is after the step of forming the substrate and before the affixation step. For example, the step of forming the electrodes may be performed before the step of mounting the IC chips.

INDUSTRIAL APPLICABILITY

As described above, the method of manufacturing the semiconductor packages in accordance with the present invention is a suitable method for such semiconductor packages with high reliability and productivity that will be mounted in camera integrated VTR's or small portable devices.

Further the integrated circuit substrate of the present invention is suitable for such semiconductor packages with high reliability and productivity that will be mounted in camera integrated VTR's or small portable devices.

What is claimed is:

1. A process for manufacturing a semiconductor package comprising,
    a circuit board fabricating step for forming a plurality of bonding patterns for IC chips to be disposed adjacent to each other side by side on a main surface of a circuit board aggregation, and forming a plurality of electrode patterns for external connection on a back of the circuit board aggregation,
    a mounting step for mounting IC chips on each circuit board on the main surface of the circuit board aggregation and electrically connecting the bonding patterns and the IC chips,
    a sealing step for sealing the IC chips with a sealing resin,
    an electrode forming step for forming projections on the electrode patterns for external connection,
    an attaching step for attaching a package aggregation unit which was fabricated by the circuit board fabricating step, the mounting step, the sealing step, and the electrode forming step to a standard member, and
    a cutting step for cutting the package aggregation unit attached on the standard member into a plurality of circuit boards, thereby obtaining a plurality of semiconductor packages each including one circuit board.

2. The process for manufacturing a semiconductor package according to claim 1, wherein a side of the package aggregation unit on which the electrodes having the projections are formed, is attached to the standard member in the attaching step.

3. The process for manufacturing a semiconductor package according to claim 2, wherein the attaching step comprises a flattening step to flatten tips of the electrodes having the projections to a uniform height and an affixing step to affix the flattened electrodes to the standard member.

4. The process for manufacturing a semiconductor package according to claim 3, wherein the flattening step further comprises grinding the tips of the electrodes having the projections to flatten the tips.

5. The process for manufacturing a semiconductor package according to claim 3, wherein the flattening step further comprises a step of heating the tips of the electrodes having the projections to flatten the tips.

6. The process for manufacturing a semiconductor package according to claim 2, wherein the attaching step comprises a flat plane forming step to form a flat surface of a resin in which the electrodes having the projections are buried and a flat plane securing step to affix the flat plane to the standard member.

7. The process for manufacturing a semiconductor package according to claim 6, wherein the flat plane forming step comprises a step of providing a frame around a periphery on the back of the circuit board aggregation and the step of filling the area of the back of a circuit board aggregate encircled by an frame with a resin to cause the electrodes having the projections to be buried in the resin.

8. The process for manufacturing a semiconductor package according to claim 6, wherein the flat plane forming step uses a screen printing method to bury the electrodes having the projections into the resin.

9. The process for manufacturing a semiconductor package according to claim 2, wherein the attaching step comprises a step of providing a frame on a main surface of the standard member, a step of providing an area encircled by the frame with a layer of a material capable of reversibly becoming liquid or solid according to a temperature, a step of dipping at least parts of the electrodes having the projections including tips thereof in a layer of the material which is in a liquid state, and a step of solidifying the material while at least parts of the electrodes having the projections are dipped in the material.

10. The process for manufacturing a semiconductor package according to claim 2, further comprising a spacer forming step prior to the attaching step, wherein the spacer forming step comprises a step of providing a spacer on the back of the circuit board aggregation in an area to be separated from the circuit board by cutting, and the attaching step comprises a step of causing the separated area to be attached to the standard member by using the spacer.

11. The process for manufacturing a semiconductor package according to claim 10, wherein the spacer is formed in the area including a malfunctioning circuit board area where no electrodes having projections are formed.

12. The process for manufacturing a semiconductor package according to claim 10, wherein a material of the spacer is almost equivalent to a material of the electrodes having the projections.

13. The process for manufacturing a semiconductor package according to claim 10, wherein the spacer is formed simultaneously with the electrodes having the projections during the electrodes forming step.

14. The process for manufacturing a semiconductor package according to claim 10, wherein the spacer has almost the same height as the electrodes having the projections.

15. The process for manufacturing a semiconductor package according to claim 2, wherein a side of the package aggregation unit on which the IC chips are mounted is attached to the standard member in the attaching step.

16. The process for manufacturing a semiconductor package according to claim 15, wherein the attaching step comprises a flattening step to flatten an upper side surface of the IC chips to a uniform height and an affixing step to affix the flattened upper side surface to the standard member.

17. The process for manufacturing a semiconductor package according to claim 16, wherein the flattening step comprises a step of cutting the upper side surface of the IC chips.

18. The process for manufacturing a semiconductor package according to claim 17, wherein a length from the main surface of the circuit board aggregation to the flattened upper side surface is longer than a length from the main surface of the circuit board aggregation to a surface of an IC circuit in the IC chips.

19. The process for manufacturing a semiconductor package according to claim 16, wherein the flattening step comprises a step of grinding an upper surface of sealing resin layered over the IC chips.

20. The process for manufacturing a semiconductor package according to claim 19, wherein when the IC chips are mounted by using a bonding wire, a length from the main surface of the circuit board aggregation to the flattened upper side surface is longer than a maximum length from the main surface of the circuit board aggregation to the bonding wire.

21. The process for manufacturing a semiconductor package according to claim 15, wherein the attaching step comprises a flat plane forming step to form a flat surface of a resin in which the IC chips are buried and a flat plane affixing step to affix the flat plane to the standard member.

22. The process for manufacturing a semiconductor package according to claim 21, wherein the flat plane forming step comprises a step of providing a frame around a periphery on the back of the circuit board aggregation and a step of filling an area of the main surface encircled by the frame with a resin to cause the IC chips to be buried in the resin.

23. The process for manufacturing a semiconductor package according to claim 21, wherein the flat plane forming step uses a screen printing method to bury the IC chips in the resin.

24. The process for manufacturing a semiconductor package according to claim 21, wherein the flat plane forming step uses a transfer molding method to bury the IC chips with the resin.

25. The process for manufacturing a semiconductor package according to claim 16, wherein the flat plane forming step comprises a step of affixing a first main surface of a flat plane to an upper surface of a sealing resin layered over the IC chips, and the flat plane affixing step comprises a step of securing a second main surface of the flat plane to the standard member.

26. The process for manufacturing a semiconductor package according to claim 25, wherein the flat plane is made of metal.

27. The process for manufacturing a semiconductor package according to claim 1, wherein the sealing resin is cut out in the cutting step together with the package aggregation unit.

28. The process for manufacturing a semiconductor package according to claim 15, further comprising a spacer forming step prior to the attaching step, wherein the spacer forming step comprises a step of providing a spacer on the main surface of the circuit board aggregation in an area to be separated from the circuit board by cutting, and the attaching step comprises the step of causing the separated area to be attached to the standard member by using the spacer.

29. The process for manufacturing a semiconductor package according to claim 10 or claim 28, wherein the separated area is used as a margin in a fabrication.

30. The process for manufacturing a semiconductor package according to claim 10 or claim 28, wherein the spacer is produced by curing a resin.

31. The process for manufacturing a semiconductor package according to claim 28, wherein the spacer is provided with an adhesive.

32. The process for manufacturing a semiconductor package according to claim 10 or claim 28, wherein the spacer is composed of a line pattern on a plane.

33. The process for manufacturing a semiconductor package according to claim 10 or claim 28, wherein a height of the spacer is almost equivalent to a distance between the circuit board aggregation and the standard member when the package aggregation unit is attached to the standard member.

34. The process for manufacturing a semiconductor package according to claim 1, wherein the package aggregation unit is attached to the standard member by vacuuming in the attaching step.

35. The process for manufacturing a semiconductor package according to claim 10 or claim 34, wherein the spacer is composed of an adsorption member having a vacuuming pipe inside thereof, and a dicing tape attached to tips of the electrodes having the projections and the member are respectively attached to the standard member by vacuuming in the attaching step.

36. The process for manufacturing a semiconductor package according to claim 28 or claim 34, wherein the spacer is composed of an adsorption member having a vacuuming pipe inside thereof, and a dicing tape attached to upper surfaces of the IC chips and the member are respectively attached to the standard member by vacuuming in the attaching step.

37. The process for manufacturing a semiconductor package according to any one of claims 34 to 36, wherein the standard member is provided with a vacuuming pipe inside thereof, the pipe having an opening on a main surface of the standard member.

38. The process for manufacturing a semiconductor package according to claim 1, wherein the circuit board aggregation is provided with margins along peripheries of two opposing sides out of four sides of quadrilateral surrounding the circuit board aggregation.

39. The process for manufacturing a semiconductor package according to claim 37, wherein a same method of cutting as applied to the cutting step is used for forming the other two opposing sides of the quadrilateral.

40. The process for manufacturing a semiconductor package according to claim 1, wherein an adhesive is used in the attaching step.

41. The process for manufacturing a semiconductor package according to claim 40, wherein a UV reactive resin is used as the adhesive.

42. The process for manufacturing a semiconductor package according to claim 40, wherein a heat reactive resin is used as the adhesive.

43. The process for manufacturing a semiconductor package according to claim 40, wherein a solvent reactive resin is used as the adhesive.

44. The process for manufacturing a semiconductor package according to claim 1, wherein the electrodes having the projections formed in the electrode forming step are solder ball electrodes.

45. The process for manufacturing a semiconductor package according to claim 1, wherein a dicing saw is used in the cutting step.

46. The process for manufacturing a semiconductor package according to claim 1, wherein the standard member is a dicing tape.

* * * * *